(12) United States Patent
Fukuoka et al.

(10) Patent No.: US 7,372,301 B2
(45) Date of Patent: May 13, 2008

(54) BUS SWITCH CIRCUIT AND INTERACTIVE LEVEL SHIFTER

(75) Inventors: Masato Fukuoka, Kanagawa (JP); Fumio Sashihara, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1289 days.

(21) Appl. No.: 10/198,463

(22) Filed: Jul. 19, 2002

(65) Prior Publication Data

US 2004/0052249 A1    Mar. 18, 2004

(30) Foreign Application Priority Data

Jul. 19, 2001   (JP) ............................. 2001-219975
Jul. 19, 2001   (JP) ............................. 2001-220033

(51) Int. Cl.
*H03K 19/0175*    (2006.01)

(52) U.S. Cl. .................... 326/81; 326/86; 326/31; 326/68; 327/437

(58) Field of Classification Search ............ 326/81, 326/86, 31; 327/437
See application file for complete search history.

(56) References Cited

U.S. PATENT DOCUMENTS

| 6,034,553 A | 3/2000 | Kwong | |
| 6,052,019 A * | 4/2000 | Kwong | 327/437 |
| 6,100,719 A * | 8/2000 | Graves et al. | 326/86 |
| 6,236,259 B1 * | 5/2001 | Goodell et al. | 327/534 |
| 6,320,408 B1 * | 11/2001 | Kwong | 326/31 |
| 6,559,703 B1 * | 5/2003 | Kwong et al. | 327/313 |
| 6,965,253 B1 * | 11/2005 | Chen et al. | 326/81 |
| 7,119,601 B2 * | 10/2006 | Grimone, III | 327/404 |

FOREIGN PATENT DOCUMENTS

| JP | 10-93416 | 4/1998 |
| JP | 2002-57560 | 2/2002 |

\* cited by examiner

*Primary Examiner*—Vibol Tan
(74) *Attorney, Agent, or Firm*—Oblon, Spivak, McClelland, Maier & Neustadt, P.C.

(57) ABSTRACT

A bus switch circuit includes a switch element having two terminals whose electrical connection is controlled when a control signal is input into a control terminal. The bus switch circuit further includes a first pull-up resistor and first switch circuit, a second pull-up resistor and second switch circuit. The control signal controls the electrical connections of the first and second switch circuits.

12 Claims, 10 Drawing Sheets

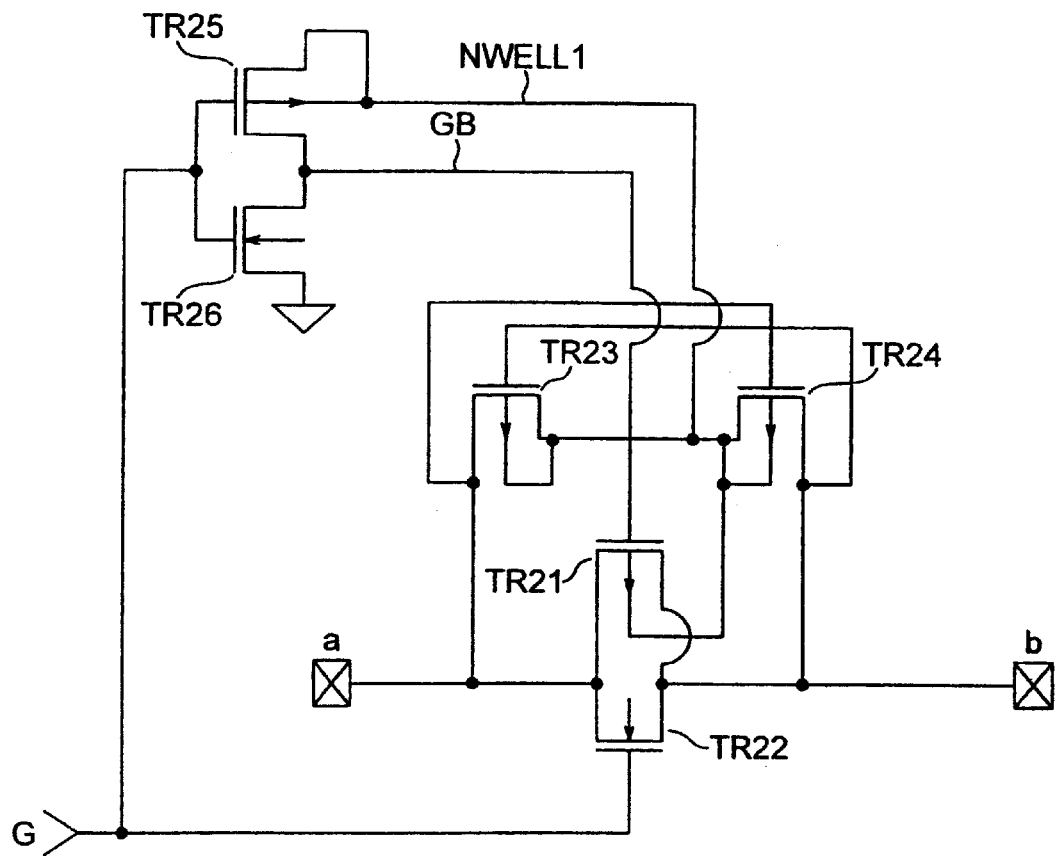
F I G. 4
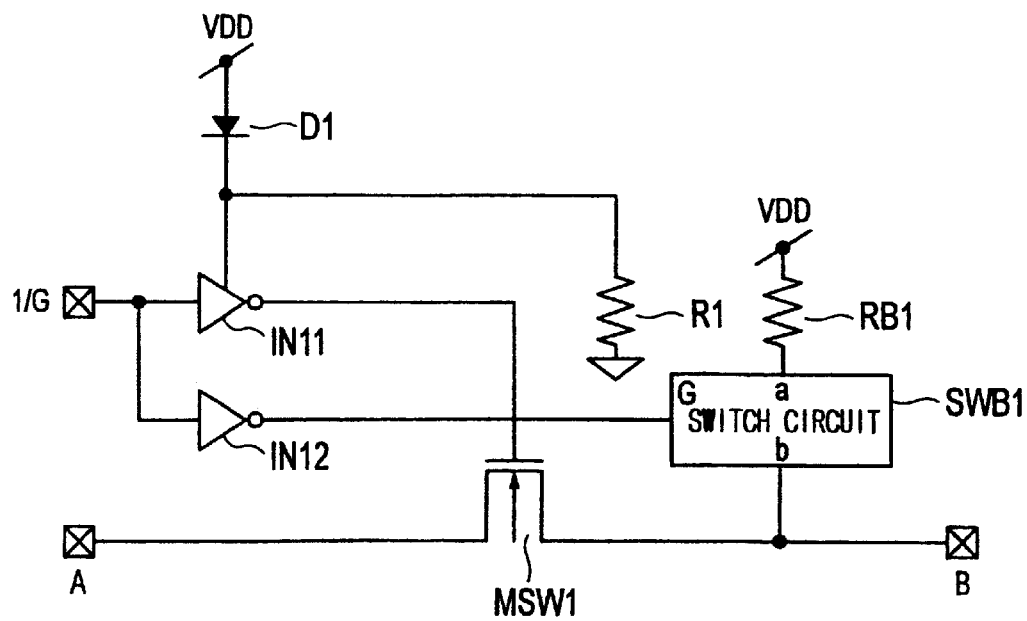
F I G. 5

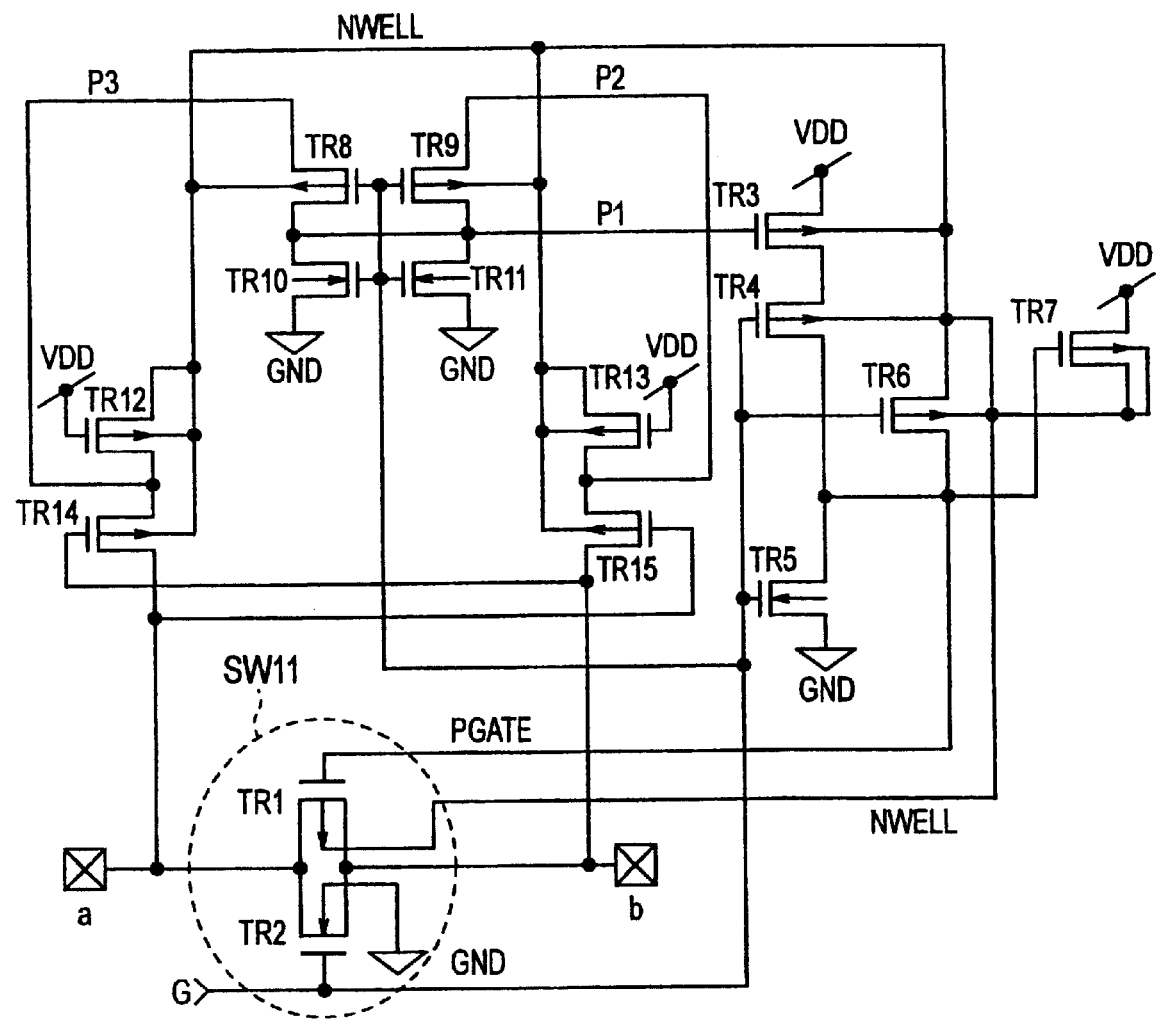
F I G. 7

US 7,372,301 B2

BUS SWITCH CIRCUIT AND INTERACTIVE LEVEL SHIFTER

CROSS-REFERENCE TO RELATED APPLICATION

This application claims benefit of priority under 35 USC 119 to Japanese Patent Application No. 2001-219975, filed on Jul. 19, 2001, and No. 2001-220033, filed on Jul. 19, 2001, the entire contents of which are incorporated by reference herein.

BACKGROUND OF THE INVENTION

The present invention relates to a bus switch circuit and an interactive level shifter.

In recent years, bus switch circuits are used in many products. For example, when first and second circuits which operate upon receiving a power supply voltage are connected, a bus switch circuit is used to, e.g., block the signal path to prevent any operation error caused when a signal output from the first circuit is input to the second circuit before the power supply voltage is supplied to the second circuit.

FIG. 10 shows the arrangement of a conventional bus switch circuit. The source and drain of a switch element SW formed from an n-channel transistor are connected between terminals A and B. The gate of the n-channel transistor is connected to a control terminal C through an inverter IN2.

A control signal is input from the control terminal C, inverted by the inverter IN2, and input to the gate of the switch element SW. When a control signal of low level is input, the switch element SW is turned on to connect the terminal A to the terminal B. When a control signal of high level is input, the switch element SW is turned off to disconnect the terminal A from the terminal B.

However, the conventional bus switch circuit has the following problem.

When a control signal of low level is input to turn on the switch element SW, a voltage input from the terminal A is externally output from the terminal B through the switch element SW. Alternatively, a voltage input from the terminal B is externally output from the terminal A through the switch element SW. At this time, because of the characteristics of the n-channel MOS transistor, a voltage VIN input to the terminal A or B drops by a threshold value Vth and is output from the terminal B or A as a voltage VIN-Vth.

In recent years, ICs (Integrated Circuits) which operate upon receiving different voltages, e.g., 3.3 V and 5 V, are often connected. In this case, an interactive level shifter must be inserted between the ICs to convert the high level of a signal.

A conventional level shifter has the arrangement shown in FIG. 11. Terminals A and B are connected to the input and output terminals of different ICs, respectively. A circuit CT1 is connected to the terminal A. A circuit CT2 is connected to the terminal B. A logic level converter LLC is inserted between the circuits.

The circuit CT1 has inverters IN31 to IN35 and AND circuits AN31 and AN32 and operates upon receiving a power supply voltage VccA. The circuit CT2 has inverters IN41 and IN42 and operates upon receiving a power supply voltage VccB.

A direction control signal DIR and switch control signal /G are input to the circuits CT1 and CT2. The terminals A and B are controlled by the switch control signal /G to a connectable state (switch enable) or a high-impedance unconnectable state (switch disable). In the switch enable mode, the input/output direction of a signal between the terminals A and B is determined by the direction control signal DIR.

However, the above-described conventional interactive level shifter has the following problems.

The two kinds of power supply voltages VccA and VccB are necessary for level shift, resulting in an increase in cost.

In addition, since each of the circuits CT1 and CT2 and logic level converter LLC is constituted by a logic circuit with a multi-stage structure, the signal propagation speed between the terminals A and B is low, resulting in a signal delay.

Furthermore, the logic level converter LLC can shift the level using a diode. However, for interactive level shift, a pull-up resistor must be externally attached to prevent any voltage drop by a switch element, resulting in an increase in device area. Simultaneously, power consumption increases due to a DC current that flows to the resistor in the switch disable mode.

SUMMARY OF THE INVENTION

A bus switch circuit according to an aspect of the present invention comprises a switch element which has two terminals connected between first and second terminals and whose electrical connection is controlled when a control signal is input to a control terminal, a first pull-up resistor and first switch circuit connected in series between a power supply voltage terminal and the first terminal, and a second pull-up resistor and second switch circuit connected in series between the power supply voltage terminal and the second terminal, wherein electrical connection of the first switch circuit is controlled upon receiving the control signal, when the switch element is turned on, the first switch circuit is turned on to connect the power supply voltage terminal to the first terminal through the first pull-up resistor, and when the switch element is turned off, the first switch circuit is turned off to disconnect the power supply voltage terminal from the first terminal, and electrical connection of the second switch circuit is controlled upon receiving the control signal, when the switch element is turned on, the second switch circuit is turned on to connect the power supply voltage terminal to the second terminal through the second pull-up resistor, and when the switch element is turned off, the second switch circuit is turned off to disconnect the power supply voltage terminal from the second terminal.

An interactive level shifter according to an aspect of the present invention comprises a level shift section which receives a power supply voltage and outputs a first power supply voltage lower by a predetermined voltage, a control signal generation section which receives the first power supply voltage and outputs a first control signal having the power supply voltage at high level and a second control signal having the first power supply voltage at high level, a switch element having two terminals connected between first and second terminals and whose electrical connection is controlled when the second control signal is input to a control terminal, and a pull-up resistor and switch circuit connected in series between a power supply voltage terminal and the second terminal, wherein electrical connection of the switch circuit is controlled upon receiving the first control signal, when the switch element is turned on, the switch circuit is turned on to connect the power supply voltage terminal to the second terminal through the pull-up resistor, and when the switch element is turned off, the switch circuit is turned off to disconnect the power supply voltage terminal from the second terminal.

An interactive level shifter according to another aspect of the present invention comprises a level shift section which receives a power supply voltage and outputs a first power supply voltage lower by a predetermined voltage, a control signal generation section which outputs a first switching control signal having the power supply voltage at high level and a second switching control signal having the first power supply voltage at high level, a switch element having two terminals connected between first and second terminals and whose electrical connection is controlled when the second switching control signal is input to a control terminal, a control signal generation section which receives a direction control signal to control a level shift direction and the first switching control signal, executes control so as to cause the direction control signal to level-shift a signal whose high level equals a low voltage input to the first terminal to a signal whose high level equals a high voltage and output the signal from the second terminal or executes control so as to cause the direction control signal to level-shift a signal whose high level equals the high voltage input to the second terminal to a signal whose high level equals the low voltage and output the signal from the first terminal, when the first switching control signal is in a switch enable mode, generates a second ON signal to turn on a second switch circuit and executes control so as to cause the direction control signal to level-shift a signal whose high level equals the high voltage input to the first terminal to a signal whose high level equals the low voltage and output the signal from the second terminal or executes control so as to cause the direction control signal to level-shift a signal whose high level equals the low voltage input to the second terminal to a signal whose high level equals the high voltage and output the signal from the first terminal, when the first control signal is in the switch enable mode, generates a first ON signal to turn on a first switch circuit, and when the first control signal is in a switch disable mode, generates and outputs first and second OFF signals, a first pull-up resistor and first switch circuit connected series between a power supply voltage terminal and the first terminal, and a second pull-up resistor and second switch circuit connected series between the power supply voltage terminal and the second terminal, wherein upon receiving the first ON signal, the first switch circuit is turned on to connect the power supply voltage terminal to the first terminal through the first pull-up resistor, and upon receiving the first OFF signal, the first switch circuit is turned off to disconnect the power supply voltage terminal from the first terminal, and upon receiving the second ON signal, the second switch circuit is turned on to connect the power supply voltage terminal to the second terminal through the second pull-up resistor, and upon receiving the second OFF signal, the second switch circuit is turned off to disconnect the power supply voltage terminal from the second terminal.

BRIEF DESCRIPTION OF THE DRAWINGS

FIG. 4 is a circuit diagram showing the arrangement of a switch circuit of a bus switch circuit according to the third embodiment;

FIG. 5 is a circuit diagram showing the arrangement of an interactive level shifter according to the fourth embodiment of the present invention;

FIG. 7 is a circuit diagram showing another arrangement of the switch circuit in the interactive level shifter;

DESCRIPTION OF THE PREFERRED EMBODIMENTS

The embodiments of the present invention will be describedbelow with reference to the accompanying drawings.

A bus switch circuit according to this embodiment outputs an input voltage using a pull-up resistor without any voltage drop and, in turning off a switch, blocks the path of a DC current to reduce power consumption, as will be described later.

Figure 1:
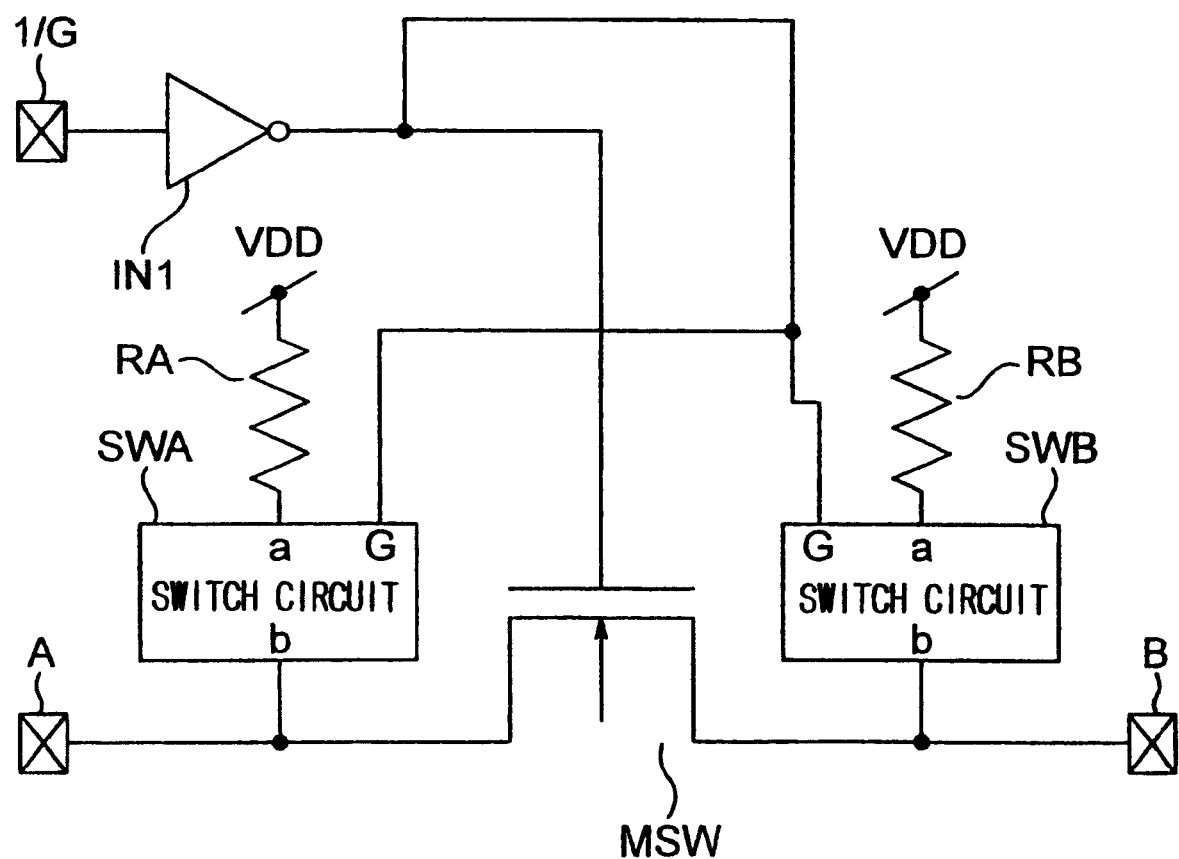
FIG. 1 is a circuit diagram showing the arrangement of a a bus switch circuit according to an embodiment of the present invention.

FIG. 1 shows the arrangement of a bus switch circuit according to an embodiment of the present invention.

One terminal and the other terminal of a main switch element MSW formed from an n-channel MOS transistor are connected to terminals A and B, respectively. A control terminal C is connected to the gate of the main switch element MSW through an inverter IN1.

In this embodiment, a resistor RA and switch circuit SWA are connected in series between a power supply voltage VDD terminal and the terminal A. A resistor RB and switch circuit SWB are connected in series between the power supply voltage VDD terminal and the terminal B. The switch circuits SWA and SWB are ON/OFF-controlled by a control signal G inverted by the inverter IN1 and input from the control terminal C. Terminals a of the switch circuits SWA and SWB are connected to the power supply voltage VDD terminal through the resistors RA and RB, respectively. Terminals b of the switch circuits SWA and SWB are connected to the terminals A and B, respectively. The control signal G is input to terminals G.

As will be described later, while the control signal G is at high level (switch enable), and the main switch MSW is turned on, the switch circuits SWA and SWB are turned on. When the switch circuit SWA is turned on, the terminal A is connected to the power supply voltage VDD terminal through the resistor RA serving as a pull-up resistor. Similarly, when the switch circuit SWB is turned on, the terminal B is connected to the power supply voltage VDD terminal through the resistor RB serving as a pull-up resistor. In this state, a voltage VIN input from the terminal A is externally output from the terminal B without any voltage drop corresponding to a threshold voltage Vth of the switch element MSW. Similarly, the voltage VIN input from the terminal B is externally output from the terminal A without any voltage drop corresponding to the threshold voltage Vth.

Since the terminals A and B are pulled up to the power supply voltage VDD through the pull-up resistors RA and RB, respectively, while the switch MSW is kept on, the input voltage VIN can be output without any voltage drop.

The switch circuits SWA and SWB are turned off while the control signal G is at low level (switch disable), and the main switch MSW is turned off. Hence, even when the terminals A and B are at low level, a DC current is prevented from flowing from the power supply voltage VDD terminal through the resistors RA and RB, switch circuits SWA and SWB, and terminals A and B.

As described above, the bus switch circuit according to this embodiment can output a signal that fully swings without any voltage drop corresponding to the resistance in the switch element MSW by connecting the terminals A and B connected to the switch element MSW to the power supply voltage VDD terminal through the pull-up resistors RA and RB and switch circuits SWA and SWB. When the switch element MSW is turned off, the switch circuit SWA or SWB is also turned off. Hence, wasteful current consumption from the power supply voltage VDD terminal to the terminal A or B through the pull-up resistor RA or RB can be prevented.

Detailed circuit arrangements of the switch circuit SWA or SWB will be described next as the first to third embodiments of the present invention.

In the following embodiments, a switch element having a CMOS structure is used. Before a description of the first to third embodiments, a problem that is posed when a switch element including a p-channel transistor is used will be described.

Figure 12:
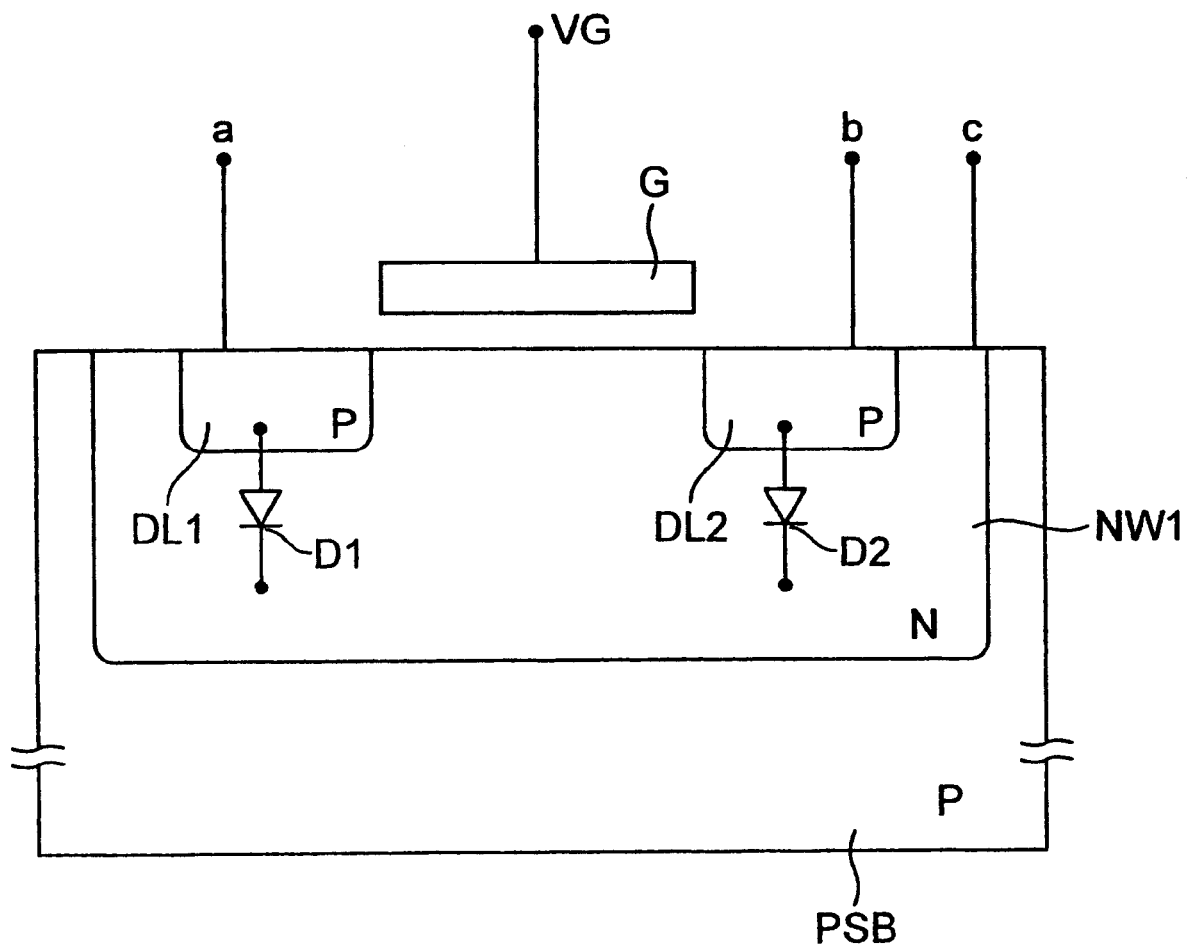
FIG. 12 is a longitudinal sectional view showing a diode which is parasitic on a p-channel transistor.

As shown in FIG. 12, in a p-channel transistor, normally, p-type impurity diffusion layers DL1 and DL2 are formed in an n-well NW1 formed in a surface region of a p-type semiconductor substrate PSB. A gate electrode G is formed between the diffusion layers DL1 and DL2 via a gate insulating film (not shown).

However, diodes D1 and D2 are parasitic between the diffusion layer DL1 and the n-well NW1 and between the diffusion layer DL2 and the n-well NW1. Hence, even when a gate voltage VG at the same level as that of a power supply voltage VDD is applied to the gate G to turn off the transistor, if a voltage higher than the power supply voltage VDD supplied to the n-well NW1 is input to one diffusion layer DL2, a current flows from the diffusion layer DL2 to the power supply voltage VDD terminal through the parasitic diode D2 and n-well NW1, resulting in an increase in current consumption.

To solve this problem, voltages to be applied to the n-well NW1 and gate G to turn off the p-channel transistor must be set as follows.

(A) When both voltages applied to diffusion layers DL1 and DL2 are lower than power supply voltage VDD The power supply voltage VDD is applied to the n-well NW1 and gate G as usual.

(B) When at least one of voltages applied to diffusion layers DL1 and DL2 is higher than power supply voltage VDD A higher one of the voltages applied to the diffusion layers DL1 and DL2 is applied to the n-well NW1 and gate G.

With this arrangement, the p-channel transistor can be completely turned off independently of the voltages applied to the diffusion layers DL1 and DL2. Any wasteful current can be prevented from flowing from the diffusion layers DL1 and DL2 to the power supply voltage VDD terminal through the parasitic diodes D1 and D2 and n-well NW1. Hence, the current consumption can be reduced. The first to third embodiments to be described below are constituted on the basis of this technique.

(1) First Embodiment

Figure 2:
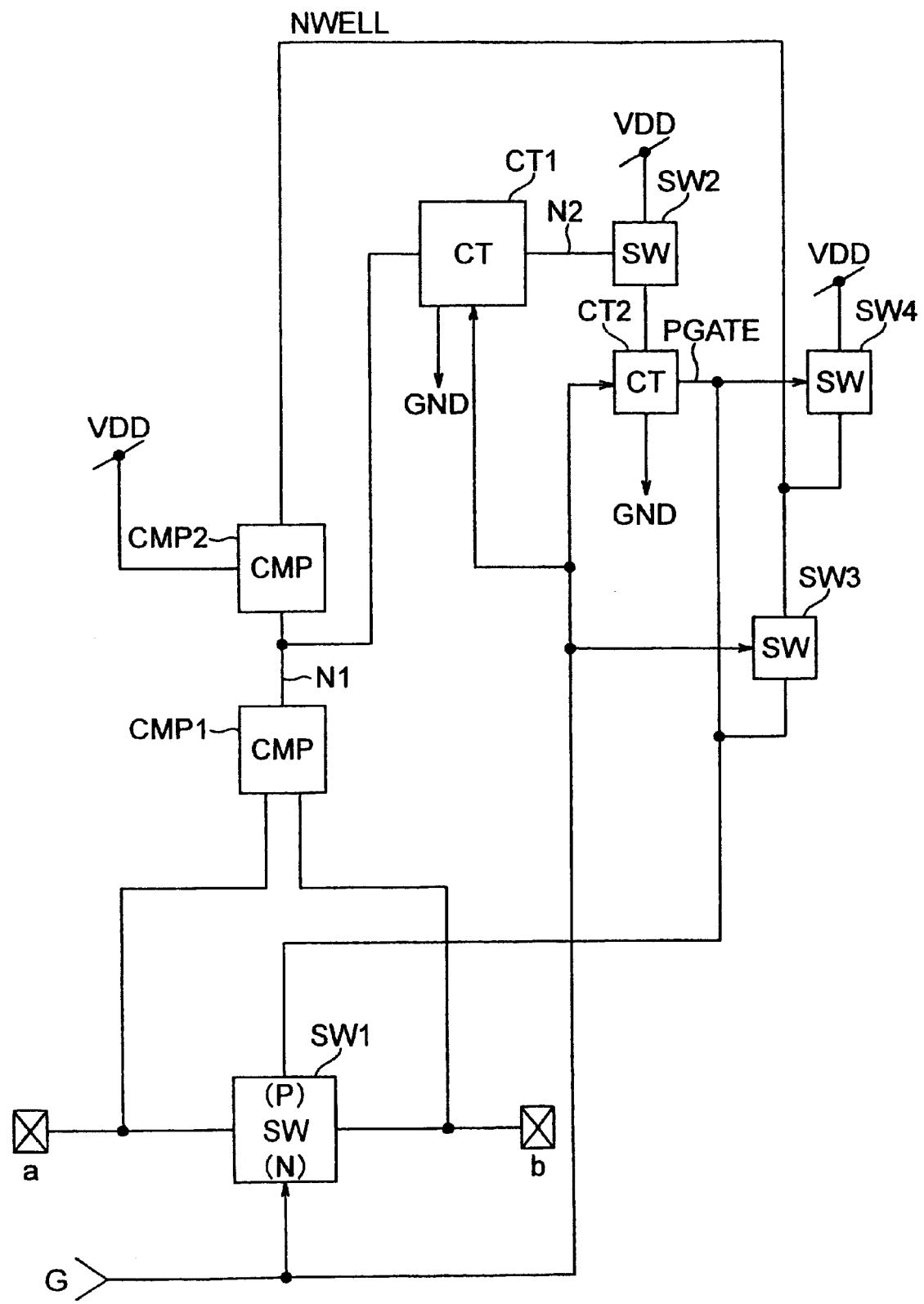
FIG. 2 is a circuit diagram showing the arrangement of a switch circuit of a bus switch circuit according to the first embodiment.

FIG. 2 shows the detailed circuit arrangement of a switch circuit SWA or SWB according to the first embodiment of the present invention.

A switch element SW1 having a CMOS structure formed from a p-channel transistor and n-channel transistor is connected between terminals a and b. The n-channel transistor is turned on/off by a control signal G (switch enable at high level and switch disable at low level). The p-channel transistor whose gate receives a gate signal PGATE is turned on in the switch enable mode and off in the switch disable mode, like the n-channel transistor.

The terminals a and b are connected to a comparator CMP1. The potentials of the terminals a and b are compared, and a higher potential is output to a node N1.

A comparator CMP2 compares the potential of the node N1 with a power supply voltage VDD. When the potential of the node N1 is equal to or higher than the power supply voltage VDD, the node N1 and n-well NWELL are connected and set at an equipotential level. Conversely, when the potential of the node N1 is lower than the power supply voltage VDD, the node N1 is electrically disconnected from the n-well NWELL.

The potential of the node N1 is supplied to a circuit CT1. When the control signal G is at high level (switch enable), the circuit CT1 sets a node N2 at the same level as a ground voltage Vss. When the control signal G is at low level (switch disable), the circuit CT1 connects the nodes N1 and N2 to set them at an equipotential level.

A switch element SW2 and circuit CT2 are connected in series between the power supply voltage VDD terminal and the ground terminal. The switch element SW2 is turned on/off by the potential of the node N2. The circuit CT2 sets the potential of the node PGATE (gate signal supplied to the gate of the p-channel transistor of the switch element SW1) to the power supply voltage VDD or ground voltage Vss supplied through the switch element SW2 in accordance with the control signal G.

A switch element SW3 controls electrical connection between the n-well NWELL and the node PGATE in accordance with the control signal G.

A switch element SW4 controls electrical connection between the power supply voltage VDD terminal and the n-well NWELL in accordance with the potential of the node PGATE.

This embodiment having the above arrangement operates in the following way in the respective cases.

(a1) Switch Enable Mode

In the switch enable mode, the control signal G is at high level, and the n-channel transistor of the switch element SW1 is turned on. The comparator CMP1 compares the potentials of the terminals a and b and outputs a higher potential to the node N1. The comparator CMP2 compares the potential of the node N1 with the power supply voltage VDD. When the potential of the node N1 is higher, then-well NWELL is connected to the node N1. Otherwise, they are electrically disconnected.

Although the circuit CT1 receives the potential of the node N1, the circuit CT1 sets the node N2 at the ground voltage Vss upon receiving the control signal G of high level regardless of the potential of the node N1. The switch element SW2 whose control terminal receives the ground voltage Vss is turned on. Upon receiving the control signal G, the circuit CT2 connects the node PGATE and ground terminal and outputs the gate signal PGATE of low level. The p-channel transistor of the switch element SW1, whose gate receives the gate signal PGATE, is turned on. Upon receiving the gate signal PGATE of low level, the switch element SW4 is turned on to supply the power supply voltage VDD to the n-well NWELL. However, the switch element SW3 is turned off upon receiving the control signal G of high level to disconnect the n-well NWELL of power supply voltage VDD level from the node PGATE of low level.

With this operation, both the p-channel transistor and the n-channel transistor of the switch element SW1 are turned on. The terminals a and b are electrically connected as usual.

(b1) When Both Potential of Node N1 and that of Node N2 are Lower than Power Supply Voltage VDD in Switch Disable Mode In the switch disable mode, the control signal G is at low level, and the n-channel transistor of the switch element SW1 is turned off. The comparator CMP1 compares the potentials of the terminals a and b and outputs a higher potential to the node N1. The comparator CMP2 compares the potential of the node N1 with the power supply voltage VDD. Since the power supply voltage VDD is higher, the n-well NWELL is electrically disconnected from the node N1.

Upon receiving the control signal G of low level and the potential of the node N1, the circuit CT1 outputs the potential of the node N1 to the node N2. The potential of the node N2 is input to the control terminal of the switch element SW2. This potential is lower than the power supply voltage VDD and turns on the switch element SW2. The switch element SW2 outputs the power supply voltage VDD to the circuit CT2. Upon receiving the control signal G, the circuit CT2 outputs the supplied power supply voltage VDD to the node PGATE.

Upon receiving the gate signal PGATE of the same level as the power supply voltage VDD terminal, the p-channel transistor of the switch element SW1 is turned off. Upon receiving the gate signal PGATE of high level, the switch element SW4 is turned off to disconnect the n-well NWELL from the power supply voltage VDD terminal. Upon receiving the control signal G of low level, the switch element SW3 is turned on to connect the node PGATE of the same level as the power supply voltage VDD to the n-well NWELL.

Upon receiving the gate signal PGATE of the same level as the power supply voltage VDD, the p-channel transistor of the switch element SW1 is turned off together with the n-channel transistor. In addition, the power supply voltage VDD is supplied to the n-well NWELL. Both the potentials of the terminals a and b connected to the two diffusion layers of the p-channel transistor of the switch element SW1 are lower than the power supply voltage VDD. For this reason, any current is prevented from flowing from the terminals a and b to the power supply voltage VDD terminal through the n-well NWELL. In addition, of the switch element SW2 and circuit CT2 connected in series between the power supply voltage VDD terminal and the ground terminal, the switch element SW2 is turned on, though the circuit CT2 disconnects the switch element SW2 from the ground terminal. Hence, any through current between the power supply voltage VDD terminal and the ground terminal is prevented.

(c1) When at Least One of Potentials of Nodes N1 and N2 is Equal to or Higher than Power Supply Voltage VDD in Switch Disable Mode The control signal G is at low level, and the n-channel transistor of the switch element SW1 is turned off. The comparator CMP1 compares the potentials of the terminals a and b and outputs a higher potential to the node N1. The comparator CMP2 compares the potential of the node N1 with the power supply voltage VDD. Since the potential of the node N1 is higher, the n-well NWELL is connected to the node N1.

Upon receiving the control signal G of low level and the potential of the node N1, the circuit CT1 outputs the potential of the node N1 to the node N2. The switch element SW2 whose control terminal receives the potential of the node N2 is turned off because that potential is higher than the power supply voltage VDD. For this reason, the switch element SW2 does not supply the power supply voltage VDD to the circuit CT2. The circuit CT2 receives the control signal G. However, the circuit CT2 does not increase the potential of the node PGATE because no power supply voltage VDD is supplied Upon receiving the control signal G of low level, the switch element SW3 is turned on to connect the node PGATE to the n-well which receives the potential of the node N1 at level higher than the power supply voltage VDD. Hence, the potential of the gate signal PGATE becomes higher than the power supply voltage VDD and equal to a higher one of the potentials of the terminals a and b. The switch element SW4 is turned off upon receiving the gate signal PGATE.

A higher one of the potentials of the terminals a and b is supplied to both the n-well and the gate of the p-channel transistor of the switch element SW1 to completely turn off the switch element SW1. Any current is prevented from flowing from the terminal a or b to the power supply voltage VDD terminal through the diffusion layers, parasitic diodes, and n-well NWELL. In addition, of the switch element SW2 and circuit CT2 which connect the power supply voltage VDD terminal and ground terminal in series, the switch element SW2 is turned off. Hence, any through current is also prevented.

As described above, according to this embodiment, in the switch enable mode, operation is executed as usual without any errors. In the switch disable mode, at the p-channel transistor of the switch element SW1, any current is prevented from flowing from the terminal a or b to the power supply voltage VDD terminal through a parasitic diode. In addition, any through current between the power supply voltage VDD terminal and the ground terminal is also prevented.

(2) Second Embodiment

Figure 3:
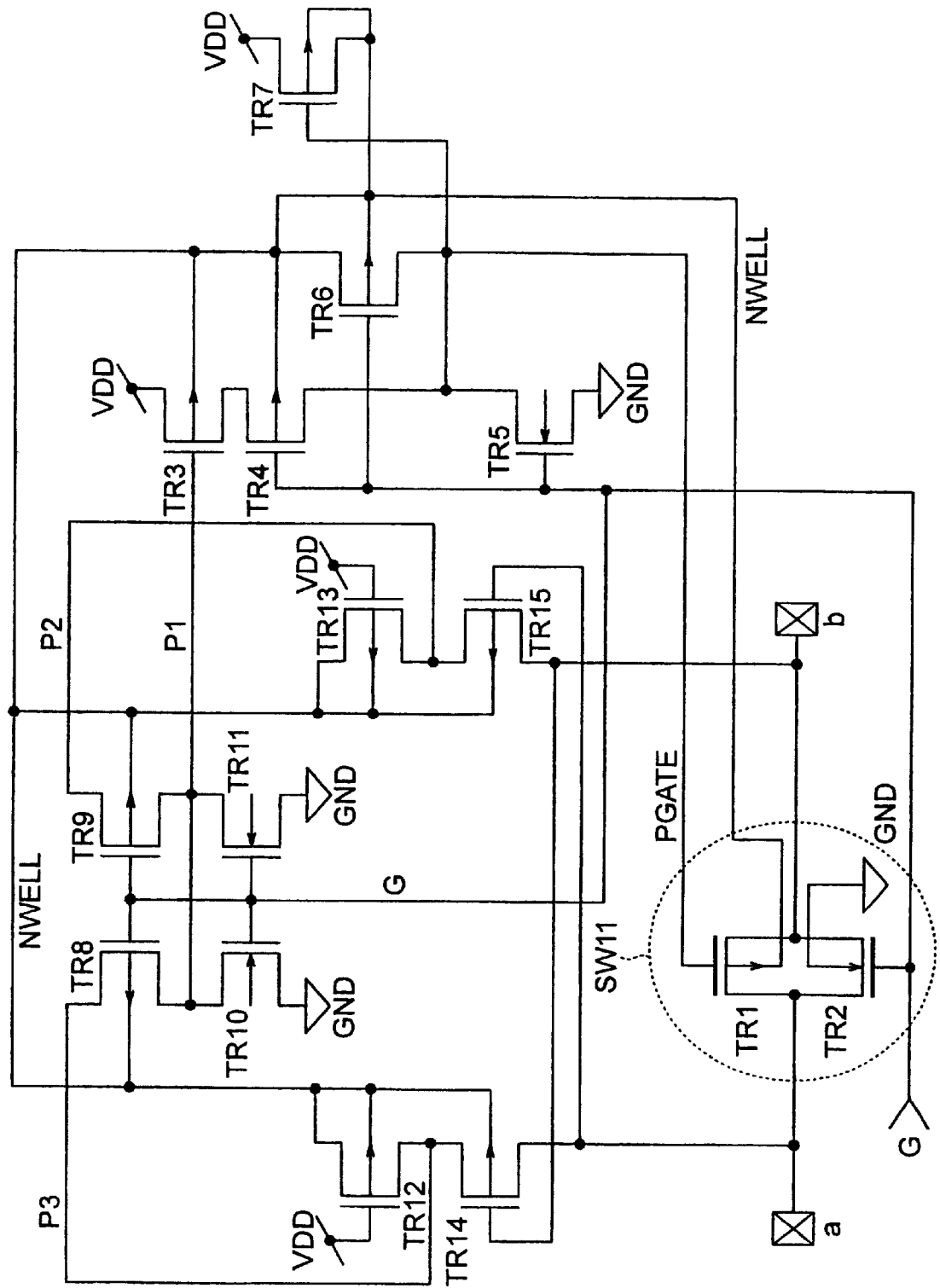
FIG. 3 is a circuit diagram showing the arrangement of a switch circuit of a bus switch circuit according to the second embodiment.

FIG. 3 shows the detailed circuit arrangement of a switch circuit SWA or SWB according to the second embodiment of the present invention.

The sources and drains of a p-channel transistor TR1 and n-channel transistor TR2, which form a switch element SW1, are connected between terminals a and b. The gate of the transistor TR1 is connected to a node PGATE. A control signal G is input to the gate of the transistor TR2.

The terminals of p-channel transistors TR3 and TR4 and n-channel transistor TR5 are connected in series between a power supply voltage VDD terminal and a ground terminal.

The gate of the transistor TR3 is connected to a node P1. The control signal G is input to the gates of the transistors TR3 to TR5.

One terminal of a p-channel transistor TR6 is connected to an n-well NWELL. The control signal G is input to the gate of the transistor TR6. The other terminal is connected to the node PGATE.

One terminal of a p-channel transistor TR7 is connected to the power supply voltage VDD terminal. The other terminal is connected to the n-well NWELL. The gate is connected to the node PGATE.

The terminals of p-channel transistors TR12 and TR14 are connected in series between the n-well NWELL and the terminal a. The gate of the transistor TR12 is connected to the power supply voltage VDD terminal. The gate of the transistor TR14 is connected to the terminal b.

The terminals of p-channel transistors TR13 and TR15 are connected in series between the n-well NWELL and the terminal b. The gate of the transistor TR13 is connected to the power supply voltage VDD terminal. The gate of the transistor TR15 is connected to the terminal a.

The terminals of p-channel transistors TR8 and TR10 are connected in series between the ground terminal and a node P3 to which one terminal of the transistor TR12 and one terminal of the transistor TR14 are connected. The terminals of p-channel transistors TR9 and TR11 are connected in series between the ground terminal and a node P2 to which one terminal of the transistor TR13 and one terminal of the transistor TR15 are connected. The control signal G is input to all the gates of the transistors TR8 to TR11.

Both a node which connects one terminal of the transistor TR8 and one terminal of the transistor TR10 and a node which connects one terminal of the transistor TR9 and one terminal of the transistor TR11 are connected to the node P1.

All the back gates of the p-channel transistors TR1, TR3, TR4, TR6 to TR9, and TR12 to TR15 are connected to the n-well NWELL.

As a correspondence with the first embodiment, the switch element SW1 corresponds to the p-channel transistor TR1 and n-channel transistor TR2, the comparator CMP1 corresponds to the transistors TR14 and TR15, the comparator CMP2 corresponds to the transistors TR12 and TR13, the circuit CT1 corresponds to the transistors TR8 to TR11, the switch element SW2 corresponds to the transistor TR3, the circuit CT2 corresponds to the transistors TR4 and TR5, the switch element SW3 corresponds to the transistor TR6, and the switch element SW4 corresponds to the transistor TR7.

The operation of this embodiment with the above arrangement will be described.

The n-channel transistor TR2 of the switch element SW1 is turned on/off by the control signal G (switch enable at high level and switch disable at low level). The p-channel transistor TR1 whose gate receives the potential of the node PGATE, i.e., the gate signal PGATE is turned on in the switch enable mode and off in the switch disable mode, like the n-channel transistor.

The potentials of the terminals a and b are compared by the transistors TR14 and TR15. When the potential of the terminal a is higher, the transistor TR14 is turned on to output this potential to the node P3. When the potential of the terminal b is higher, the transistor TR15 is turned on to output this potential to the node P2. As a result, the potentials of the terminals a and b are compared, and a higher potential is output to the node P3 or P2.

The transistor TR12 compares the potential of the node P3 with the power supply voltage VDD. When the potential of the node P3 is equal to or higher than the power supply voltage VDD, the node P3 and n-well NWELL are connected and set at an equipotential level. Conversely, when the potential of the node P3 is lower than the power supply voltage VDD, the node P3 is electrically disconnected from the n-well NWELL. Similarly, the transistor TR13 compares the potential of the node P2 with the power supply voltage VDD. When the potential of the node P2 is equal to or higher than the power supply voltage VDD, the node P2 and n-well NWELL are connected and set at an equipotential level. Conversely, when the potential of the node P2 is lower than the power supply voltage VDD, the node P2 is electrically disconnected from the n-well NWELL.

The potential of the node P3 or P2 is supplied to one terminal of the transistor TR8 or TR9. The transistors TR8 to TR11 are ON/OFF-controlled by the control signal G supplied to their gates. When the control signal G is at high level, the node P1 is set at the same level as a ground voltage Vss. When the control signal G is at low level, the node P3 or P2 is connected to the node P1, and the node P1 is set at the same level as the potential of the node P3 or P2, i.e., a higher one of the potentials of the terminals a and b.

Of the transistors TR3 to TR5 connected in series between the power supply voltage VDD terminal and the ground terminal, the transistor TR3 is ON/OFF-controlled by the potential of the node P1, which is applied to the gate, to supply or stop supplying the power supply voltage VDD terminal to the drain of the transistor TR4. The transistors TR4 and TR5 are ON/OFF-controlled by the control signal G applied to their gates to set the potential of the node PGATE to the power supply voltage VDD supplied from the transistor TR3 or the ground voltage Vss.

The transistor TR6 controls connection between the n-well NWELL and the node PGATE in accordance with the control signal G.

The transistor TR7 controls connection between the power supply voltage VDD terminal and the n-well NWELL in accordance with the potential of the node PGATE.

This embodiment having the above arrangement operates in the following way in the respective cases.

(a2) Switch Enable Mode

In the switch enable mode, the control signal G is at high level, and the n-channel transistor TR2 of the switch element SW1 is turned on. The transistors TR14 and TR15 compare the potentials of the terminals a and b and output a higher potential to the node P3 or P2. When the potential of the terminal a is higher, the transistor TR14 is turned on to output the potential to the node P3. When the potential of the terminal b is higher, the transistor TR15 is turned on to output the potential to the node P2.

The transistor TR12 compares the potential of the node P3 with the power supply voltage VDD. When the potential of the node P3 is higher, the n-well NWELL is connected to the node P3. Otherwise, they are electrically disconnected. The transistor TR13 compares the potential of the node P2 with the power supply voltage VDD. When the potential of the node P2 is higher, the n-well NWELL is connected to the node P2. Otherwise, they are electrically disconnected.

Upon receiving the control signal G of high level, the transistors TR8 and TR9 are turned off, and the transistors TR10 and TR11 are turned off. Hence, the node P1 is set at the ground voltage Vss independently of the potential of the node P3 or P2. The transistor TR3 whose control terminal receives the ground voltage Vss is turned on. For the transistors TR4 and TR5, the transistor TR5 is turned on upon receiving the control signal G to connect the node PGATE to the ground terminal and output the gate signal PGATE of low level. The p-channel transistor TR1 of the switch element SW1, whose gate receives the gate signal PGATE, is turned on. Upon receiving the gate signal PGATE of low level, the transistor TR7 is turned on to supply the power supply voltage VDD to the n-well NWELL. Upon receiving the control signal G of high level, the transistor TR6 is turned off to disconnect the n-well NWELL of power supply voltage VDD level from the node PGATE of low level.

With this operation, both the p-channel transistor TR1 and the n-channel transistor TR2 of the switch element SW1 are turned on. Hence, the terminals a and b are electrically connected as usual while the power supply voltage VDD is kept supplied to the n-well NWELL.

(b2) When Both Potential of Terminal a and that of Terminal b are Lower than Power Supply Voltage VDD in Switch Disable Mode In the switch disable mode, the control signal G is at low level, and the n-channel transistor TR2 of the switch element SW1 is turned off. The transistors TR14 and TR15 compare the potentials of the terminals a and b and output a higher potential to the node P3 or P2. When the potential of the terminal a is higher, the transistor TR14 is turned on to output the potential to the node P3. When the potential of the terminal b is higher, the transistor TR15 is turned on to output the potential to the node P2. The transistor TR12 compares the potential of the node P3 with the power supply voltage VDD. Since the power supply voltage VDD is higher, the node P3 is electrically disconnected from the n-well NWELL. The transistor TR13 compares the potential of the node P2 with the power supply voltage VDD. Since the power supply voltage VDD is higher, the node P2 is electrically disconnected from the n-well NWELL.

The control signal G is at low level. Hence, of the transistors TR8 to TR11, the transistors TR8 and TR9 are turned on, and the transistors TR10 and TR11 are turned off. A higher one of the potentials of the terminals a and b is supplied to the node P1 through the node P3 or P2. This potential is lower than the power supply voltage VDD. For this reason, the transistor TR3 whose gate receives that potential is turned on to output the power supply voltage VDD to one terminal of the transistor TR4. The transistor TR4 whose gate receives the control signal of low level is turned on. The transistor TR5 is turned off. The node PGATE is set at the power supply voltage VDD. The transistors TR1 and TR7 whose gates receive that potential are turned off. Upon receiving the control signal G of low level, the transistor TR6 is turned on to supply the power supply voltage VDD to the n-well NWELL.

As a result, both the p-channel transistor and the n-channel transistor of the switch element SW1 are turned off, and the power supply voltage VDD is supplied to the n-well NWELL. The potentials of the terminals a and b connected to two diffusion layers of the p-channel transistor TR1 of the switch element SW1 are lower than the power supply voltage VDD. Hence, any current is prevented from flowing from the terminals a and b to the power supply voltage VDD terminal through the parasitic diodes and n-well NWELL. In addition, of the transistors TR3 to TR5 connected in series between the power supply voltage VDD terminal and the ground terminal, the transistor TR5 is turned off. Hence, any through current between the power supply voltage VDD terminal and the ground terminal is prevented.

(c2) When at Least One of Potentials of Terminals a and b is Equal to or Higher than Power Supply Voltage VDD in Switch Disable Mode Since the control signal G is at low level, the n-channel transistor TR2 of the switch element SW1 is turned off. The transistors TR14 and TR15 compare the potentials of the terminals a and b and output a higher potential to the node P3 or P2. When the potential of the terminal a is higher, the transistor TR14 is turned on to output the potential to the node P3. When the potential of the terminal b is higher, the transistor TR15 is turned on to output the potential to the node P2. The transistor TR12 compares the potential of the node P3 with the power supply voltage VDD. When the potential of the node P3 is higher, the node P3 is electrically connected to the n-well NWELL. The transistor TR13 compares the potential of the node P2 with the power supply voltage VDD. When the potential of the node P2 is higher, the node P2 is electrically connected to the n-well NWELL.

The control signal G is at low level. Hence, of the transistors TR8 to TR11, the transistors TR8 and TR9 are turned on, and the transistors TR10 and TR11 are turned off. A higher one of the potentials of the terminals a and b is supplied to the node NWELL through the transistors TR12 and TR14 or TR13 and TR15. This potential is also supplied to the node P3 or P2 through the transistor TR14 or TR15. Of the transistors TR8 to TR11, the transistors TR8 and TR9 are turned on, and the transistors TR10 and TR11 are turned off. For this reason, a higher one of the potentials of the terminal a and b is supplied to the node P1 through the nodes P3 and P2.

This potential is equal to or higher than the power supply voltage VDD. For this reason, the transistor TR3 whose gate receives this potential is turned off, The transistor TR4 whose gate receives the control signal G of low level is turned on. The transistor TR5 is turned off. On the other hand, since the transistor TR6 whose gate receives the control signal G of low level is turned on, the n-well NWELL is connected to the node PGATE. That is, both the n-well NWELL and node PGATE are set at a higher one of the potentials of the terminals a and b.

Hence, both the p-channel transistor and the n-channel transistor of the switch element SW1 are turned off. A higher one of the potentials of the terminals a and b, which are set at potentials equal to or higher than the power supply voltage VDD, is supplied to the n-well NWELL. At least one of the potentials of the terminals a and b connected to two diffusion layers of the p-channel transistor TR1 of the switch element SW1 is equal to or higher than the power supply voltage VDD. However, this potential is input to the n-well NWELL and gate. Hence, any current is prevented from flowing from the terminal a or b to the power supply voltage VDD terminal. In addition, of the transistors TR3 to TR5 connected in series between the power supply voltage VDD terminal and the ground terminal, the transistors TR3 and TR5 are turned off. Hence, any through current between the power supply voltage VDD terminal and the ground terminal is prevented.

As described above, according to this embodiment, in the switch enable mode, operation is executed as usual without any errors. In the switch disable mode, at the p-channel transistor TR1 of the switch element SW1, any current is prevented from flowing from the terminal a or b to the power supply voltage VDD terminal through a parasitic diode. In addition, any through current between the power supply voltage VDD terminal and the ground terminal is also prevented.

With switch circuits SWA and SWB having the arrangement shown in FIG. 2 or 3, the bus switch circuit shown in FIG. 1 operates in the following way. In the switch enable mode (control signal G is at high level), when a main switch MSW is turned on to connect the terminals A and B, the attached switch circuits SWA and SWB are also turned on.

The terminals A and B are pulled up by resistors RA and RB through the switch circuits SWA and SWB, respectively. The high level of the output signal is pulled up to the level of the power supply voltage VDD. Hence, a signal that fully swings can be obtained.

Assume that the main switch MSW is turned off in the switch disable mode. Even when the potential of the terminal A or B is 0 V, the terminals a and b in the switch circuits SWA and SWB are disconnected. The terminals A and B are disconnected from the resistors RA and RB, respectively. Hence, any unwanted DC current is prevented from flowing from the power supply voltage VDD terminal to the terminal A or B through the resistor RA or RB.

(3) Third Embodiment

As another example of switch circuit SWA or SWB shown in FIG. 1, the third embodiment of the present invention will be described with reference to FIG. 4.

One terminal and the other terminal of each of p-channel transistor TR21 and n-channel transistor TR22 of the switch element of a CMOS circuit are connected in parallel between terminals a and b. A control signal G is input to the gate of the transistor TR22. The gate of the transistor TR21 is connected to a node GB.

The potential of the node GB is determined by the ON/OFF states of transistors TR25 and TR26. The terminals of the p-channel transistor TR25 and n-channel transistor TR26 are connected in series between an n-well NWELL1 and a ground terminal.

The potential of the node GB, which is determined by inputting the control signal G to the gates of the transistors TR25 and TR26, is input to the gate of the transistor TR21, thereby controlling electrical connection.

The terminals of p-channel transistors TR23 and TR24 are connected in series between the terminals a and b. One terminal of each of the transistors TR23 and TR24 is connected to the n-well NWELL1. The gate of the transistor TR23 is connected to the terminal b. The gate of the transistor TR24 is connected to the terminal a. The transistors TR23 and TR24 supply a higher one of the potentials of the terminals a and b to the n-well NWELL1. More specifically, when the potential of the terminal a is higher than that of the terminal b, the transistor TR23 is turned on, and the transistor TR24 is turned off to connect the terminal a to the n-well NWELL1. When the potential of the terminal b is higher than that of the terminal a, the transistor TR23 is turned off, and the transistor TR24 is turned on to connect the terminal b to the n-well NWELL1.

This embodiment with the above arrangement operates as follows.

(a3) Switch Enable Mode

One transistor TR22, which constitutes the switch element and whose gate receives the control signal G of high level, is turned on. The transistor TR25 is turned off. The transistor TR26 is turned on. The node GB changes to low level. The other transistor TR21, which constitutes the switch element and whose gate receives the potential of the node GB, is turned on.

The transistors TR23 and TR24 compare the potentials of the terminals a and b. When the potential of the terminal a is higher, the potential is output to the n-well NWELL1 through the transistor TR23. However, since a power supply voltage VDD is supplied to the n-well NWELL1 by a circuit (not shown), the potential of the n-well NWELL1 equals the power supply voltage VDD independently of the potentials of the terminals a and b.

When the transistor TR25 is turned off, the node GB of low level is electrically disconnected from the n-well NWELL1 of power supply voltage VDD level.

As a consequence, both the transistors TR21 and TR22 are turned on. The power supply voltage VDD is supplied to the n-well NWELL1 to set the switch enable state without any error.

(b3) When Both Potentials of Terminals a and b are Lower than Power Supply Voltage VDD in Switch Disable Mode The transistor TR22 whose gate receives the control signal G of low level is turned off. The transistor TR25 is turned on. The transistor TR26 is turned off.

The transistors TR23 and TR24 compare the potentials of the terminals a and b. For example, when the potential of the terminal a is higher, the potential is output to the n-well NWELL1 through the transistor TR23. However, the power supply voltage VDD is supplied to the n-well NWELL1 by a circuit (not shown). In addition, both the potentials of the terminals a and b are lower than the power supply voltage VDD. For these reasons, the potential of the n-well NWELL1 equals the power supply voltage VDD independently of the potentials of the terminals a and b.

When the transistor TR25 is turned on, the node GB is connected to the n-well NWELL1. Hence, the node GB is set at the power supply voltage VDD, like the n-well NWELL1.

With this operation, both the transistors TR21 and TR22 are turned off to set the switch disable state. Both the n-well NWELL1 and the node GB are set at the power supply voltage VDD independently of the potentials of the terminals a and b. The transistor TR21 is completely turned off to prevent any wasteful current.

(c3) When at Least One of Potentials of Terminals a and b is Higher than Power Supply Voltage VDD in Switch Disable Mode The transistor TR22 whose gate receives the control signal G of low level is turned off. The transistor TR25 is turned on. The transistor TR26 is turned off.

The transistors TR23 and TR24 compare the potentials of the terminals a and b. For example, when the potential of the terminal a is higher, the potential is output to the n-well NWELL1 through the transistor TR23. This potential is higher than the power supply voltage VDD. Hence, the potential of the terminal a or b, which is higher than the power supply voltage VDD, is supplied to the n-well NWELL1.

When the transistor TR25 is turned on, the node GB is connected to the n-well NWELL1. Hence, the node GB is set at the potential of the terminal a or b, which is higher than the power supply voltage VDD.

As a result, both the transistors TR21 and TR22 are turned off to set the switch disable state. Both the n-well NWELL1 and the node GB are set at the potential of the terminal a or b, which is higher than the power supply voltage VDD. The transistor TR21 is completely turned off to prevent any wasteful current.

The operation of the bus switch circuit shown in FIG. 1 when it has the switch circuits SWA and SWB according to the third embodiment will be described.

In the circuit arrangement shown in FIG. 1, when a main switch MSW formed from an n-channel transistor is turned on to transmit a signal between terminals A and B, the voltage on the output side becomes lower than the power supply voltage VDD terminal by a threshold voltage Vth because of the characteristics of the n-channel transistor. However, since the switch circuits SWA and SWB having the above arrangement and resistors RA and RB are added, the switch circuits SWA and SWB are also turned on and pulled up by ht resistors RA and RB while the main switch MSW is kept on. With this operation, the voltage drop in output signal of the power supply voltage VDD level by the threshold voltage Vth can be prevented, and a signal that fully swings can be extracted.

Assume that the control signal G is at low level, and the main switch MSW is turned off. When the potential connected to the terminals a and b is 0 V, the switch circuits SWA and SWB can be disconnected in the switch disable mode to electrically disconnect the power supply voltage VDD terminal, pull-up resistors RA and RB, and the terminals A and B such that no unwanted DC current flows through the pull-up resistors RA and RB, thereby reducing current consumption.

The above-described embodiments are merely examples and do not limit the present invention. For example, the arrangements of the switch circuits SWA and SWB shown in FIGS. 2 to 4 are merely examples, and changes and modifications can be made as needed.

An interactive level shifter according to an embodiment of the present invention will be described below with reference to the accompanying drawings.

(1) Fourth Embodiment

An interactive level shifter according to the fourth embodiment of the present invention has the arrangement shown in FIG. 5. In this embodiment, the level relationship between power supply voltages at high level is fixed. More specifically, a signal of a low power supply voltage VccA (e.g., 3.3 V) input from a terminal A is level-shifted to a signal of a high power supply voltage VccB (e.g., 5.0 V) and output from a terminal B. Alternatively, a signal of the high power supply voltage VccB (e.g., 5.0 V) input from the terminal B is level-shifted to a signal of the low power supply voltage VccA (e.g., 3.3 V) and output from the terminal A.

One terminal and the other terminal of a main switch element MSW1 formed from an n-channel MOS transistor are connected to the terminals A and B, respectively. A control terminal 1/G is connected to the gate of the main switch element MSW1 through an inverter IN11.

In addition, a resistor RB1 and switch circuit SWB1 are connected in series between a power supply voltage VDD terminal and the terminal B. The power supply voltage VDD equals the high power supply voltage VccB. In this embodiment, the interactive level shifter operates upon receiving the single power supply VDD.

The switch circuit SWB1 is ON/OFF-controlled by a control signal G input from a control terminal C and inverted by an inverter IN12. A terminal a of the switch circuit SWB1 is connected to the power supply voltage VDD terminal through the resistor RB1. A terminal b is connected to the terminal B. The control signal G is input to a control terminal G.

As will be described later, while the control signal G is at high level (switch enable), and the main switch MSW1 is kept on, the switch circuit SWB1 is turned on. When the switch circuit SWB1 is turned on, the terminal a is connected to the power supply voltage VDD terminal through the resistor RB1 serving as a pull-up resistor.

A diode D1 and resistor R1, which serve as a level shift circuit, are connected in series between the power supply voltage VDD terminal and a ground voltage Vss terminal. A voltage VDD-Vdth, which is lower by an operation threshold voltage Vdth of the diode D1, is output from the connection node between the diode D1 and the resistor R1. This voltage is input to the power supply side terminal of the inverter IN11. With this level shift circuit, the power supply voltage VDD-Vdth, which is lower by the operation threshold voltage Vdth (normally about 0.7 V) of the diode D1, is supplied to the inverter IN11.

In this arrangement, the voltage VDD-Vdth (e.g., 5−0.7=4.3 V) is applied to the gate of the main switch MSW1. A threshold voltage Vth (e.g., 1 V) of the n-channel transistor of the main switch MSW1 is taken into consideration. When a signal whose high level equals the low power supply voltage VccA (e.g., 3.3 V) is input to the terminal A, a voltage (e.g., 4.3 V) higher than the low power supply voltage VccA (e.g., 3.3 V) by the threshold voltage Vth (e.g., 1 V) of the n-channel transistor is input to the gate of the n-channel transistor. Hence, the n-channel transistor is turned on.

Since the power supply voltage VDD (e.g., 5 V) is connected to the terminal B through the pull-up resistor RB1 and switch circuit SWB1 in the ON state, a signal whose high level equals the power supply voltage VDD is output from the terminal B.

With this operation, a signal whose high level equals the low power supply voltage VccA and which is input from the terminal A is output from the terminal B as a signal whose high level equals the high power supply voltage VccB without any voltage drop corresponding to the threshold voltage Vth of the main switch element MSW1.

As described above, while the main switch element MSW1 is kept on, the terminal B is pulled up to the power supply voltage VDD through the switch circuit SWB1 and pull-up resistor RB1. For this reason, the voltage that should be output from the output terminal B can be output without any voltage drop.

Conversely, when a signal whose high level equals the high power supply voltage VccB is input from the terminal B, the signal is output from the terminal A as a signal whose high level equals the low power supply voltage VccA that is lower by the threshold voltage Vth of the main switch element MSW1 and the operation threshold voltage Vdth of the diode D1.

The switch circuit SWB1 is turned off while the control signal G is at low level (switch disable) and the main switch MSW1 is turned off. With this operation, any DC current is prevented from flowing from the power supply voltage VDD terminal through the resistor RB1, switch circuit SWB1, and terminal B even when the terminal B is at low level.

Detailed circuit arrangements of the switch circuit SWB1 will be described next using some examples.

In the following circuit examples, a switch element having a CMOS structure is used. Before a description of the circuit examples, a problem that is posed when a switch element including a p-channel transistor is used will be described.

As shown in FIG. 12, in a p-channel transistor, normally, p-type impurity diffusion layers DL1 and DL2 are formed in an n-well NW1 formed in a surface region of a p-type semiconductor substrate PSB. A gate electrode G is formed between the diffusion layers DL1 and DL2 via a gate insulating film (not shown).

However, diodes D1 and D2 are parasitic between the diffusion layer DL1 and the n-well NW1 and between the diffusion layer DL2 and the n-well NW1. Hence, even when a gate voltage VG at the same level as that of the power supply voltage VDD is applied to the gate G to turn off the transistor, if a voltage higher than the power supply voltage VDD supplied to the n-well NW1 is input to one diffusion layer DL2, a current flows from the diffusion layer DL2 to the power supply voltage VDD terminal through the parasitic diode D2 and n-well NW1, resulting in an increase in current consumption.

To solve this problem, voltages to be applied to the n-well NW1 and gate G to turn off the p-channel transistor must be set as follows.

(A) When both voltages applied to diffusion layers DL1 and DL2 are lower than power supply voltage VDD The power supply voltage VDD is applied to the n-well NW1 and gate G as usual.

(B) When at least one of voltages applied to diffusion layers DL1 and DL2 is higher than power supply voltage VDD A higher one of the voltages applied to the diffusion layers DL1 and DL2 is applied to the n-well NW1 and gate G.

With this arrangement, the p-channel transistor can be completely turned off independently of the voltages applied to the diffusion layers DL1 and DL2. Any wasteful current can be prevented from flowing from the diffusion layers DL1 and DL2 to the power supply voltage VDD terminal through the parasitic diodes D1 and D2 and n-well NW1. Hence, the current consumption can be reduced. The circuit examples of the switch circuit SWB1 to be described below are constituted on the basis of this technique.

i) Example of Switch Circuit

Figure 6:
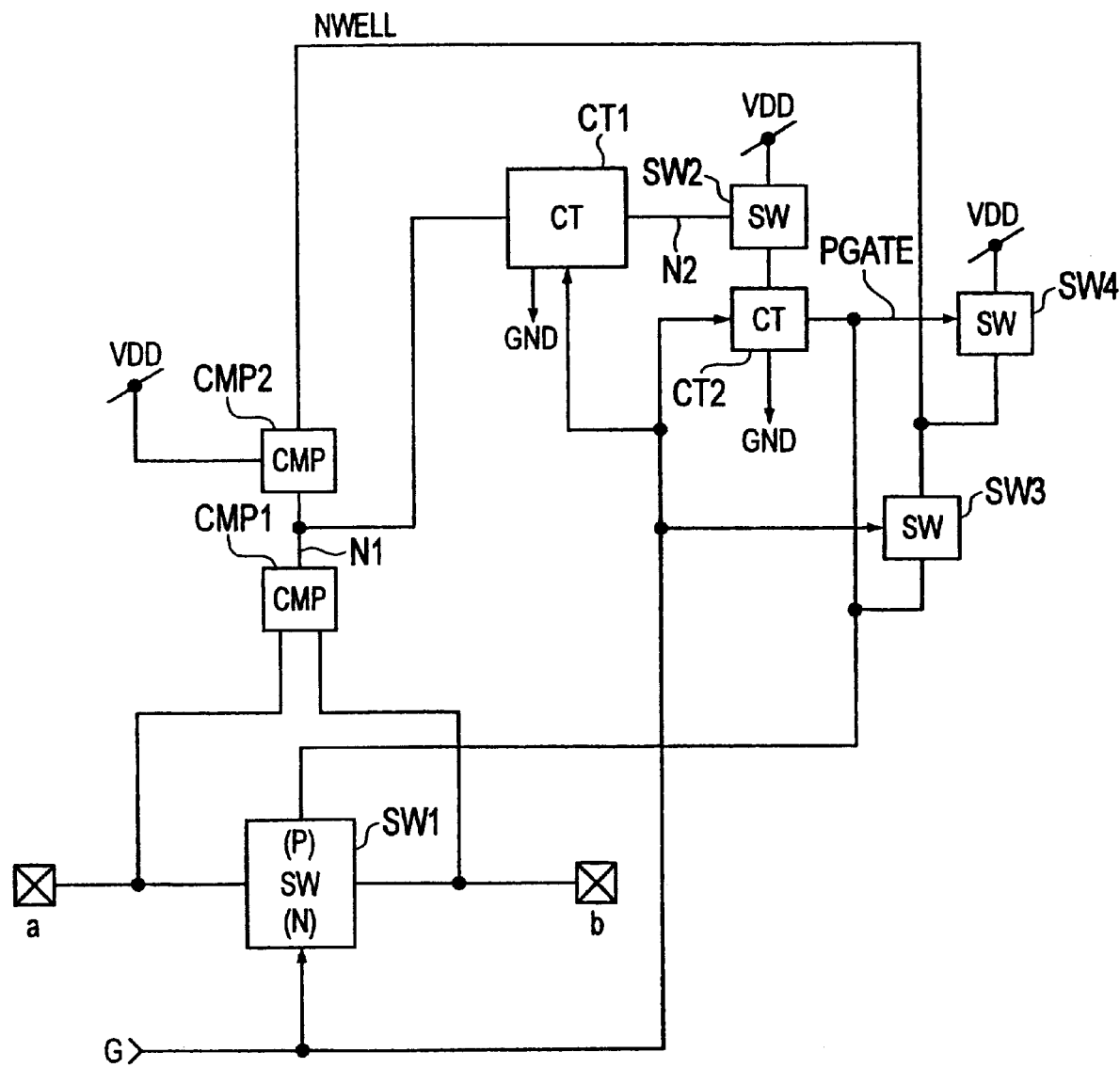
FIG. 6 is a circuit diagram showing an arrangement of the switch circuit in the interactive level shifter.

FIG. 6 shows an example of the switch circuit SWB1.

A switch element SW1 having a CMOS structure formed from a p-channel transistor and n-channel transistor is connected between terminals a and b. The n-channel transistor is turned on/off by a control signal G (switch enable at high level and switch disable at low level). The p-channel transistor whose gate receives a gate signal PGATE is turned on in the switch enable mode and off in the switch disable mode, like the n-channel transistor.

The terminals a and b are connected to a comparator CMP1. The potentials of the terminals a and b are compared, and a higher potential is output to a node N1.

A comparator CMP2 compares the potential of the node N1 with a power supply voltage VDD. When the potential of the node N1 is equal to or higher than the power supply voltage VDD, the node N1 and n-well NWELL are connected and set at an equipotential level. Conversely, when the potential of the node N1 is lower than the power supply voltage VDD, the node N1 is electrically disconnected from the n-well NWELL.

The potential of the node N1 is supplied to a circuit CT1. When the control signal G is at high level (switch enable), the circuit CT1 sets a node N2 at the same level as a ground voltage Vss. When the control signal G is at low level (switch disable), the circuit CT1 connects the nodes N1 and N2 to set them at an equipotential level.

A switch element SW2 and circuit CT2 are connected in series between the power supply voltage VDD terminal and the ground terminal. The switch element SW2 is turned on/off by the potential of the node N2. The circuit CT2 sets the potential of the node PGATE (gate signal supplied to the gate of the p-channel transistor of the switch element SW1) to the power supply voltage VDD or ground voltage Vss supplied through the switch element SW2 in accordance with the control signal G.

A switch element SW3 controls electrical connection between the n-well NWELL and the node PGATE in accordance with the control signal G.

A switch element SW4 controls electrical connection between the power supply voltage VDD terminal and the n-well NWELL in accordance with the potential of the node PGATE.

This embodiment having the above arrangement operates in the following way in the respective cases.

(a1) Switch Enable Mode

In the switch enable mode, the control signal G is at high level, and the n-channel transistor of the switch element SW1 is turned on. The comparator CMP1 compares the potentials of the terminals a and b and outputs a higher potential to the node N1. The comparator CMP2 compares the potential of the node N1 with the power supply voltage VDD. When the potential of the node N1 is higher, the n-well NWELL is connected to the node N1. Otherwise, they are electrically disconnected.

Although the circuit CT1 receives the potential of the node N1, the circuit CT1 sets the node N2 at the ground voltage Vss upon receiving the control signal G of high level regardless of the potential of the node N1. The switch element SW2 whose control terminal receives the ground voltage Vss is turned on. Upon receiving the control signal G, the circuit CT2 connects the node PGATE and ground terminal and outputs the gate signal PGATE of low level. The p-channel transistor of the switch element SW1, whose gate receives the gate signal PGATE, is turned on. Upon receiving the gate signal PGATE of low level, the switch element SW4 is turned on to supply the power supply voltage VDD to the n-well NWELL. However, the switch element SW3 is turned off upon receiving the control signal G of high level to disconnect the n-well NWELL of power supply voltage VDD level from the node PGATE of low level.

With this operation, both the p-channel transistor and the n-channel transistor of the switch element SW1 are turned on. The terminals a and b are electrically connected as usual.

(b1) When Both Potential of node N1 and that of Node N2 are Lower than Power Supply Voltage VDD in Switch Disable Mode In the switch disable mode, the control signal G is at low level, and the n-channel transistor of the switch element SW1 is turned off. The comparator CMP1 compares the potentials of the terminals a and b and outputs a higher potential to the node N1. The comparator CMP2 compares the potential of the node N1 with the power supply voltage VDD. Since the power supply voltage VDD is higher, the n-well NWELL is electrically disconnected from the node N1.

Upon receiving the control signal G of low level and the potential of the node N1, the circuit CT1 outputs the potential of the node N1 to the node N2. The potential of the node N2 is input to the control terminal of the switch element SW2. This potential is lower than the power supply voltage VDD and turns on the switch element SW2. The switch element SW2 outputs the power supply voltage VDD to the circuit CT2. Upon receiving the control signal G, the circuit CT2 outputs the supplied power supply voltage VDD to the node PGATE.

Upon receiving the gate signal PGATE of the same level as the power supply voltage VDD terminal, the p-channel transistor of the switch element SW1 is turned off. Upon receiving the gate signal PGATE of high level, the switch element SW4 is turned off to disconnect the n-well NWELL from the power supply voltage VDD terminal. Upon receiving the control signal G of low level, the switch element SW3 is turned on to connect the node PGATE of the same level as the power supply voltage VDD to the n-well NWELL.

Upon receiving the gate signal PGATE of the same level as the power supply voltage VDD, the p-channel transistor of the switch element SW1 is turned off together with the n-channel transistor. In addition, the power supply voltage VDD is supplied to the n-well NWELL. Both the potentials of the terminals a and b connected to the two diffusion layers of the p-channel transistor of the switch element SW1 are lower than the power supply voltage VDD. For this reason, any current is prevented from flowing from the terminals a and b to the power supply voltage VDD terminal through the n-well NWELL. In addition, of the switch element SW2 and circuit CT2 connected in series between the power supply voltage VDD terminal and the ground terminal, the switch element SW2 is turned on, though the circuit CT2 disconnects the switch element SW2 from the ground terminal. Hence, any through current between the power supply voltage VDD terminal and the ground terminal is prevented.

(c1) When at Least One of Potentials of Nodes N1 and N2 is Equal to or Higher than Power Supply Voltage VDD in Switch Disable Mode The control signal G is at low level, and the n-channel transistor of the switch element SW1 is turned off. The comparator CMP1 compares the potentials of the terminals a and b and outputs a higher potential to the node N1. The comparator CMP2 compares the potential of the node N1 with the power supply voltage VDD. Since the potential of the node N1 is higher, the n-well NWELL is connected to the node N1.

Upon receiving the control signal G of low level and the potential of the node N1, the circuit CT1 outputs the potential of the node N1 to the node N2. The switch element SW2 whose control terminal receives the potential of the node N2 is turned off because that potential is higher than the power supply voltage VDD. For this reason, the switch element SW2 does not supply the power supply voltage VDD to the circuit CT2. The circuit CT2 receives the control signal G. However, the circuit CT2 does not increase the potential of the node PGATE because no power supply voltage VDD is supplied.

Upon receiving the control signal G of low level, the switch element SW3 is turned on to connect the node PGATE to the n-well which receives the potential of the node N1 at level higher than the power supply voltage VDD. Hence, the potential of the gate signal PGATE becomes higher than the power supply voltage VDD and equal to a higher one of the potentials of the terminals a and b. The switch element SW4 is turned off upon receiving the gate signal PGATE.

A higher one of the potentials of the terminals a and b is supplied to both the n-well and the gate of the p-channel transistor of the switch element SW1 to completely turn off the switch element SW1. Any current is prevented from flowing from the terminal a or b to the power supply voltage VDD terminal through the diffusion layers, parasitic diodes, and n-well NWELL. In addition, of the switch element SW2 and circuit CT2 which connect the power supply voltage VDD terminal and ground terminal in series, the switch element SW2 is turned off. Hence, any through current is also prevented.

As described above, according to this embodiment, in the switch enable mode, operation is executed as usual without any errors. In the switch disable mode, at the p-channel transistor of the switch element SW1, any current is prevented from flowing from the terminal a or b to the power supply voltage VDD terminal through a parasitic diode. In addition, any through current between the power supply voltage VDD terminal and the ground terminal is also prevented.

ii) Another Example of Switch Circuit

FIG. 7 shows another circuit arrangement of the switch circuit SWB1 in the interactive level shifter according to the fourth embodiment.

The sources and drains of a p-channel transistor TR1 and n-channel transistor TR2, which form a switch element SW1, are connected between terminals a and b. The gate of the transistor TR1 is connected to a node PGATE. A control signal G is input to the gate of the transistor TR2.

The terminals of p-channel transistors TR3 and TR4 and n-channel transistor TR5 are connected in series between a power supply voltage VDD terminal and a ground terminal. The gate of the transistor TR3 is connected to a node P1. The control signal G is input to the gates of the transistors TR3 to TR5.

One terminal of a p-channel transistor TR6 is connected to an n-well NWELL. The control signal G is input to the gate of the transistor TR6. The other terminal is connected to the node PGATE.

One terminal of a p-channel transistor TR7 is connected to the power supply voltage VDD terminal. The other terminal is connected to the n-well NWELL. The gate is connected to the node PGATE.

The terminals of p-channel transistors TR12 and TR14 are connected in series between the n-well NWELL and the terminal a. The gate of the transistor TR12 is connected to the power supply voltage VDD terminal. The gate of the transistor TR14 is connected to the terminal b.

The terminals of p-channel transistors TR13 and TR15 are connected in series between the n-well NWELL and the terminal b. The gate of the transistor TR13 is connected to the power supply voltage VDD terminal. The gate of the transistor TR15 is connected to the terminal a.

The terminals of p-channel transistors TR8 and TR10 are connected in series between the ground terminal and a node P3 to which one terminal of the transistor TR12 and one terminal of the transistor TR14 are connected. The terminals of p-channel transistors TR9 and TR11 are connected in series between the ground terminal and a node P2 to which one terminal of the transistor TR13 and one terminal of the transistor TR15 are connected. The control signal G is input to all the gates of the transistors TR8 to TR11.

Both a node which connects one terminal of the transistor TR8 and one terminal of the transistor TR10 and a node which connects one terminal of the transistor TR9 and one terminal of the transistor TR11 are connected to the node P1.

All the back gates of the p-channel transistors TR1, TR3, TR4, TR6 to TR9, and TR12 to TR15 are connected to the n-well NWELL.

As a correspondence with the circuit example shown in FIG. 6, the switch element SW1 corresponds to the p-channel transistor TR1 and n-channel transistor TR2, the comparator CMP1 corresponds to the transistors TR14 and TR15, the comparator CMP2 corresponds to the transistors TR12 and TR13, the circuit CT1 corresponds to the transistors TR8 to TR11, the switch element SW2 corresponds to the transistor TR3, the circuit CT2 corresponds to the transistors TR4 and TR5, the switch element SW3 corresponds to the transistor TR6, and the switch element SW4 corresponds to the transistor TR7.

The operation of this circuit example with the above arrangement will be described.

The n-channel transistor TR2 of the switch element SW1 is turned on/off by the control signal G (switch enable at high level and switch disable at low level). The p-channel transistor TR1 whose gate receives the potential of the node PGATE, i.e., the gate signal PGATE is turned on in the switch enable mode and off in the switch disable mode, like the n-channel transistor.

The potentials of the terminals a and b are compared by the transistors TR14 and TR15. When the potential of the terminal a is higher, the transistor TR14 is turned on to output this potential to the node P3. When the potential of the terminal b is higher, the transistor TR15 is turned on to output this potential to the node P2. As a result, the potentials of the terminals a and b are compared, and a higher potential is output to the node P3 or P2.

The transistor TR12 compares the potential of the node P3 with the power supply voltage VDD. When the potential of the node P3 is equal to or higher than the power supply voltage VDD, the node P3 and n-well NWELL are connected and set at an equipotential level. Conversely, when the potential of the node P3 is lower than the power supply voltage VDD, the node P3 is electrically disconnected from the n-well NWELL. Similarly, the transistor TR13 compares the potential of the node P2 with the power supply voltage VDD. When the potential of the node P2 is equal to or higher than the power supply voltage VDD, the node P2 and n-well NWELL are connected and set at an equipotential level. Conversely, when the potential of the node P2 is lower than the power supply voltage VDD, the node P2 is electrically disconnected from the n-well NWELL.

The potential of the node P3 or P2 is supplied to one terminal of the transistor TR8 or TR9. The transistors TR8 to TR11 are ON/OFF-controlled by the control signal G supplied to their gates. When the control signal G is at high level, the node P1 is set at the same level as a ground voltage Vss. When the control signal G is at low level, the node P3 or P2 is connected to the node P1, and the node P1 is set at the same level as the potential of the node P3 or P2, i.e., a higher one of the potentials of the terminals a and b.

Of the transistors TR3 to TR5 connected in series between the power supply voltage VDD terminal and the ground terminal, the transistor TR3 is ON/OFF-controlled by the potential of the node P1, which is applied to the gate, to supply or stop supplying the power supply voltage VDD terminal to the drain of the transistor TR4. The transistors TR4 and TR5 are ON/OFF-controlled by the control signal G applied to their gates to set the potential of the node PGATE to the power supply voltage VDD supplied from the transistor TR3 or the ground voltage Vss.

The transistor TR6 controls connection between the n-well NWELL and the node PGATE in accordance with the control signal G.

The transistor TR7 controls connection between the power supply voltage VDD terminal and the n-well NWELL in accordance with the potential of the node PGATE.

The operation of this circuit example will be described below for the respective cases.

(a2) Switch Enable Mode

In the switch enable mode, the control signal G is at high level, and the n-channel transistor TR2 of the switch element SW1 is turned on. The transistors TR14 and TR15 compare the potentials of the terminals a and b and output a higher potential to the node P3 or P2. When the potential of the terminal a is higher, the transistor TR14 is turned on to output the potential to the node P3. When the potential of the terminal b is higher, the transistor TR15 is turned on to output the potential to the node P2.

The transistor TR12 compares the potential of the node P3 with the power supply voltage VDD. When the potential of the node P3 is higher, the n-well NWELL is connected to the node P3. Otherwise, they are electrically disconnected. The transistor TR13 compares the potential of the node P2 with the power supply voltage VDD. When the potential of the node P2 is higher, the n-well NWELL is connected to the node P2. Otherwise, they are electrically disconnected.

Upon receiving the control signal G of high level, the transistors TR8 and TR9 are turned off, and the transistors TR10 and TR11 are turned off. Hence, the node P1 is set at the ground voltage Vss independently of the potential of the node P3 or P2. The transistor TR3 whose control terminal receives the ground voltage vss is turned on. For the transistors TR4 and TR5, the transistor TR5 is turned on upon receiving the control signal G to connect the node PGATE to the ground terminal and output the gate signal PGATE of low level. The p-channel transistor TR1 of the switch element SW1, whose gate receives the gate signal PGATE, is turned on. Upon receiving the gate signal PGATE of low level, the transistor TR7 is turned on to supply the power supply voltage VDD to the n-well NWELL. Upon receiving the control signal G of high level, the transistor TR6 is turned off to disconnect the n-well NWELL of power supply voltage VDD level from the node PGATE of low level.

With this operation, both the p-channel transistor TR1 and the n-channel transistor TR2 of the switch element SW1 are turned on. Hence, the terminals a and b are electrically connected as usual while the power supply voltage VDD is kept to the n-well NWELL.

(b2) When Both Potential of Terminal a and that of Terminal b are Lower than Power Supply Voltage VDD in Switch Disable Mode In the switch disable mode, the control signal G is at low level, and the n-channel transistor TR2 of the switch element SW1 is turned off. The transistors TR14 and TR15 compare the potentials of the terminals a and b and output a higher potential to the node P3 or P2. When the potential of the terminal a is higher, the transistor TR14 is turned on to output the potential to the node P3. When the potential of the terminal b is higher, the transistor TR15 is turned on to output the potential to the node P2. The transistor TR12 compares the potential of the node P3 with the power supply voltage VDD. Since the power supply voltage VDD is higher, the node P3 is electrically disconnected from the n-well NWELL. The transistor TR13 compares the potential of the node P2 with the power supply voltage VDD. Since the power supply voltage VDD is higher, the node P2 is electrically disconnected from the n-well NWELL.

The control signal G is at low level. Hence, of the transistors TR8 to TR11, the transistors TR8 and TR9 are turned on, and the transistors TR10 and TR11 are turned off. A higher one of the potentials of the terminals a and b is supplied to the node P1 through the node P3 or P2. This potential is lower than the power supply voltage VDD. For this reason, the transistor TR3 whose gate receives that potential is turned on to output the power supply voltage VDD to one terminal of the transistor TR4. The transistor TR4 whose gate receives the control signal of low level is turned on. The transistor TR5 is turned off. The node PGATE is set at the power supply voltage VDD. The transistors TR1 and TR7 whose gates receive that potential are turned off. Upon receiving the control signal G of low level, the transistor TR6 is turned on to supply the power supply voltage VDD to the n-well NWELL.

As a result, both the p-channel transistor and the n-channel transistor of the switch element SW1 are turned off, and the power supply voltage VDD is supplied to the n-well NWELL. The potentials of the terminals a and b connected to two diffusion layers of the p-channel transistor TR1 of the switch element SW1 are lower than the power supply voltage VDD. Hence, any current is prevented from flowing from the terminals a and b to the power supply voltage VDD terminal through the parasitic diodes and n-well NWELL. In addition, of the transistors TR3 to TR5 connected in series between the power supply voltage VDD terminal and the ground terminal, the transistor TR5 is turned off. Hence, any through current between the power supply voltage VDD terminal and the ground terminal is prevented.

(c2) When at Least One of Potentials of Terminals a and b is Equal to or Higher than Power Supply Voltage VDD in Switch Disable Mode Since the control signal G is at low level, the n-channel transistor TR2 of the switch element SW1 is turned off. The transistors TR14 and TR15 compare the potentials of the terminals a and b and output a higher potential to the node P3 or P2. When the potential of the terminal a is higher, the transistor TR14 is turned on to output the potential to the node P3. When the potential of the terminal b is higher, the transistor TR15 is turned on to output the potential to the node P2. The transistor TR12 compares the potential of the node P3 with the power supply voltage VDD. When the potential of the node P3 is higher, the node P3 is electrically connected to the n-well NWELL. The transistor TR13 compares the potential of the node P2 with the power supply voltage VDD. When the potential of the node P2 is higher, the node P2 is electrically connected to the n-well NWELL.

The control signal G is at low level. Hence, of the transistors TR8 to TR11, the transistors TR8 and TR9 are turned on, and the transistors TR10 and TR11 are turned off. A higher one of the potentials of the terminals a and b is supplied to the node NWELL through the transistors TR12 and TR14 or TR13 and TR15. This potential is also supplied to the node P3 or P2 through the transistor TR14 or TR15. Of the transistors TR8 to TR11, the transistors TR8 and TR9 are turned on, and the transistors TR10 and TR11 are turned off. For this reason, a higher one of the potentials of the terminal a and b is supplied to the node P1 through the nodes P3 and P2.

This potential is equal to or higher than the power supply voltage VDD. For this reason, the transistor TR3 whose gate receives this potential is turned off, The transistor TR4 whose gate receives the control signal G of low level is turned on. The transistor TR5 is turned off. On the other hand, since the transistor TR6 whose gate receives the control signal G of low level is turned on, the n-well NWELL is connected to the node PGATE. That is, both the n-well NWELL and node PGATE are set at a higher one of the potentials of the terminals a and b.

Hence, both the p-channel transistor and the n-channel transistor of the switch element SW1 are turned off. A higher one of the potentials of the terminals a and b, which are set at potentials equal to or higher than the power supply voltage VDD, is supplied to the n-well NWELL. At least one of the potentials of the terminals a and b connected to two diffusion layers of the p-channel transistor TR1 of the switch element SW1 is equal to or higher than the power supply voltage VDD. However, this potential is input to the n-well NWELL and gate. Hence, any current is prevented from flowing from the terminal a or b to the power supply voltage VDD terminal. In addition, of the transistors TR3 to TR5 connected in series between the power supply voltage VDD terminal and the ground terminal, the transistors TR3 and TR5 are turned off. Hence, any through current between the power supply voltage VDD terminal and the ground terminal is prevented.

As described above, according to this embodiment, in the switch enable mode, operation is executed as usual without any errors. In the switch disable mode, at the p-channel transistor TR1 of the switch element SW1, any current is prevented from flowing from the terminal a or b to the power supply voltage VDD terminal through a parasitic diode. In addition, any through current between the power supply voltage VDD terminal and the ground terminal is also prevented.

The interactive level shifter shown in FIG. 5, which has the switch circuit SWB1 having the arrangement shown in FIG. 6 or 7, operates in the following way. In the switch enable mode (control signal G is at high level), when the main switch MSW1 is turned on to connect the terminals A and B, the attached switch circuit SWB1 is also turned on. The terminal B on the output side is pulled up by the resistor RB1 through the switch circuit SWB1. A signal which is input from the terminal A on the input side and whose high level equals the low power supply voltage VccA (e.g., 3.3 V) is output from the terminal B on the output side through the main switch MSW1 as a signal whose high level equals the high power supply voltage VccB (e.g., 5 V). At this time, the terminal B is pulled up to the level of the power supply voltage VDD by the pull-up resistor RB1. Hence, a signal that fully swings from the ground voltage Vss to the high power supply voltage VccB can be obtained without any voltage drop corresponding to the threshold voltage of the main switch MSW1. When a signal whose high level equals the high power supply voltage VccB is input from the terminal B, the signal is level-shifted to a signal whose high level equals the low power supply voltage VccA and output from the terminal A.

Assume that the main switch MSW1 is turned off in the switch disable mode. Even when the potential of the terminal B is 0 V, the terminals a and b in the switch circuit SWB1 are disconnected. The terminal B is disconnected from the resistor RB1. Hence, any unwanted DC current is prevented from flowing from the power supply voltage VDD terminal to the terminal B through the resistor RB1.

iii) Still Another Example of Switch Circuit

Figure 8:
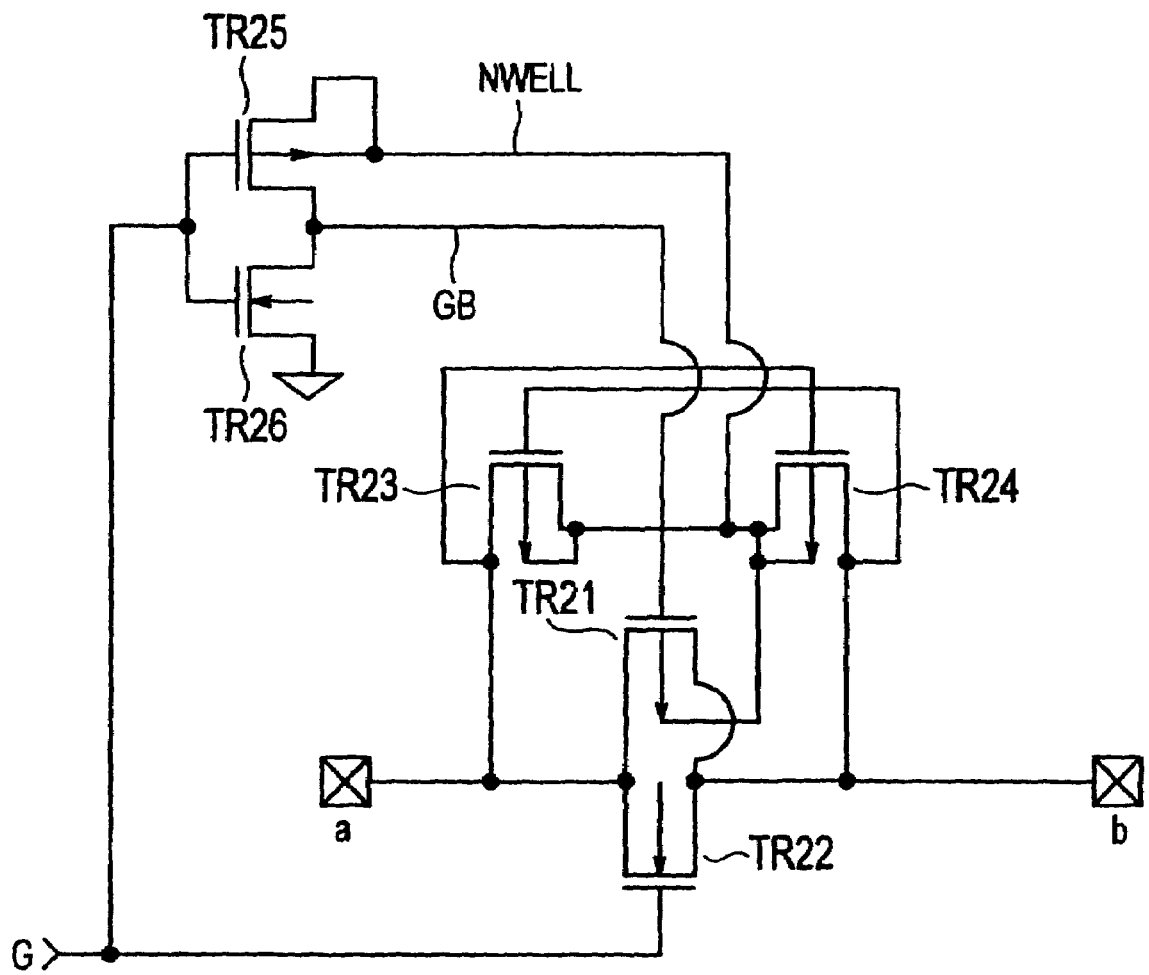
FIG. 8 is a circuit diagram showing still another arrangement of the switch circuit in the interactive level shifter.

Still another example of the switch circuit SWB1 in the interactive level shifter according to the fourth embodiment will be described next with reference to FIG. 8.

One terminal and the other terminal of each of p-channel transistor TR21 and n-channel transistor TR22 of the switch element of a CMOS circuit are connected in parallel between terminals a and b. A control signal G is input to the gate of the transistor TR22. The gate of the transistor TR21 is connected to a node GB.

The potential of the node GB is determined by the ON/OFF states of transistors TR25 and TR26. The terminals of the p-channel transistor TR25 and n-channel transistor TR26 are connected in series between an n-well NWELL1 and a ground terminal.

The potential of the node GB, which is determined by inputting the control signal G to the gates of the transistors TR25 and TR26, is input to the gate of the transistor TR21, thereby controlling electrical connection.

The terminals of p-channel transistors TR23 and TR24 are connected in series between the terminals a and b. One terminal of each of the transistors TR23 and TR24 is connected to the n-well NWELL1. The gate of the transistor TR23 is connected to the terminal b. The gate of the transistor TR24 is connected to the terminal a. The transistors TR23 and TR24 supply a higher one of the potentials of the terminals a and b to the n-well NWELL1. More specifically, when the potential of the terminal a is higher than that of the terminal b, the transistor TR23 is turned on, and the transistor TR24 is turned off to connect the terminal a to the n-well NWELL1. When the potential of the terminal b is higher than that of the terminal a, the transistor TR23 is turned off, and the transistor TR24 is turned on to connect the terminal b to the n-well NWELL1.

This example with the above arrangement operates as follows.

(a3) Switch Enable Mode

One transistor TR22, which constitutes the switch element and whose gate receives the control signal G of high level, is turned on. The transistor TR25 is turned off. The transistor TR26 is turned on. The node GB changes to low level. The other transistor TR21, which constitutes the switch element and whose gate receives the potential of the node GB, is turned on.

The transistors TR23 and TR24 compare the potentials of the terminals a and b. When the potential of the terminal a is higher, the potential is output to the n-well NWELL1 through the transistor TR23. However, since a power supply voltage VDD is supplied to the n-well NWELL1 by a circuit (not shown), the potential of the n-well NWELL1 equals the power supply voltage VDD independently of the potentials of the terminals a and b.

When the transistor TR25 is turned off, the node GB of low level is electrically disconnected from the n-well NWELL1 of power supply voltage VDD level.

As a consequence, both the transistors TR21 and TR22 are turned on. The power supply voltage VDD is supplied to the n-well NWELL1 to set the switch enable state without any error.

(b3) When Both Potentials of Terminals a and b are Lower than Power Supply Voltage VDD in Switch Disable Mode The transistor TR22 whose gate receives the control signal G of low level is turned off. The transistor TR25 is turned on. The transistor TR26 is turned off.

The transistors TR23 and TR24 compare the potentials of the terminals a and b. For example, when the potential of the terminal a is higher, the potential is output to the n-well NWELL1 through the transistor TR23. However, the power supply voltage VDD is supplied to the n-well NWELL1 by a circuit (not shown). In addition, both the potentials of the terminals a and b are lower than the power supply voltage VDD. For these reasons, the potential of the n-well NWELL1 equals the power supply voltage VDD independently of the potentials of the terminals a and b.

When the transistor TR25 is turned on, the node GB is connected to the n-well NWELL1. Hence, the node GB is set at the power supply voltage VDD, like the n-well NWELL1.

With this operation, both the transistors TR21 and TR22 are turned off to set the switch disable state. Both the n-well NWELL1 and the node GB are set at the power supply voltage VDD independently of the potentials of the terminals a and b. The transistor TR21 is completely turned off to prevent any wasteful current.

(c3) When at Least One of Potentials of Terminals a and b is Higher than Power Supply Voltage VDD in Switch Disable Mode The transistor TR22 whose gate receives the control signal G of low level is turned off. The transistor TR25 is turned on. The transistor TR26 is turned off.

The transistors TR23 and TR24 compare the potentials of the terminals a and b. For example, when the potential of the terminal a is higher, the potential is output to the n-well NWELL1 through the transistor TR23. This potential is higher than the power supply voltage VDD. Hence, the potential of the terminal a or b, which is higher than the power supply voltage VDD, is supplied to the n-well NWELL1.

When the transistor TR25 is turned on, the node GB is connected to the n-well NWELL1. Hence, the node GB is set at the potential of the terminal a or b, which is higher than the power supply voltage VDD.

As a result, both the transistors TR21 and TR22 are turned off to set the switch disable state. Both the n-well NWELL1 and the node GB are set at the potential of the terminal a or b, which is higher than the power supply voltage VDD. The transistor TR21 is completely turned off to prevent any wasteful current.

The operation of the bus switch circuit according to this embodiment, which has the switch circuit SWB1 having the arrangement shown in FIG. 6, 7, or 8 described above will be described.

With the circuit arrangement shown in FIG. 5, level shift can be realized with a simple circuit arrangement and a small number of external components by supplying a single power supply voltage VDD. When the main switch MSW1 formed from an n-channel transistor is turned on, and a signal which is input from the terminal A and whose high level equals the low power supply voltage VccA is output from the terminal B as a signal whose high level equals the high power supply voltage VccB, the voltage output from the terminal B on the output side becomes lower than the high power supply voltage VccB by the threshold voltage Vth because of the characteristics of the n-channel transistor. However, when the switch circuit SWB1 having the above-described arrangement and the pull-up resistor RB1 are added, the switch circuit SWB1 is also turned on while the main switch MSW1 is ON, and pulled up by the pull-up resistor RB1. This prevents any voltage drop corresponding to the threshold voltage. For this reason, a signal which fully swings from the ground voltage Vss to the high power supply voltage VccB can be extracted. When a signal whose high level equals the high power supply voltage VccB is input from the terminal B, the signal can be output from the terminal A as a signal whose high level equals the low power supply voltage VccA that is lower by the threshold voltage Vth of the main switch MSW1 and the operation threshold voltage Vdth of the diode D1.

Assume that the control signal G is at low level, and the main switch MSW1 is turned off. When the potential connected to the terminals a and b is 0 V, the switch circuit SWB1 can be disconnected in the switch disable mode to electrically disconnect the power supply voltage VDD terminal, pull-up resistor RB1, and terminal B such that no unwanted DC current flows through the pull-up resistor RB1, thereby reducing current consumption.

(2) Fifth Embodiment

Figure 9:
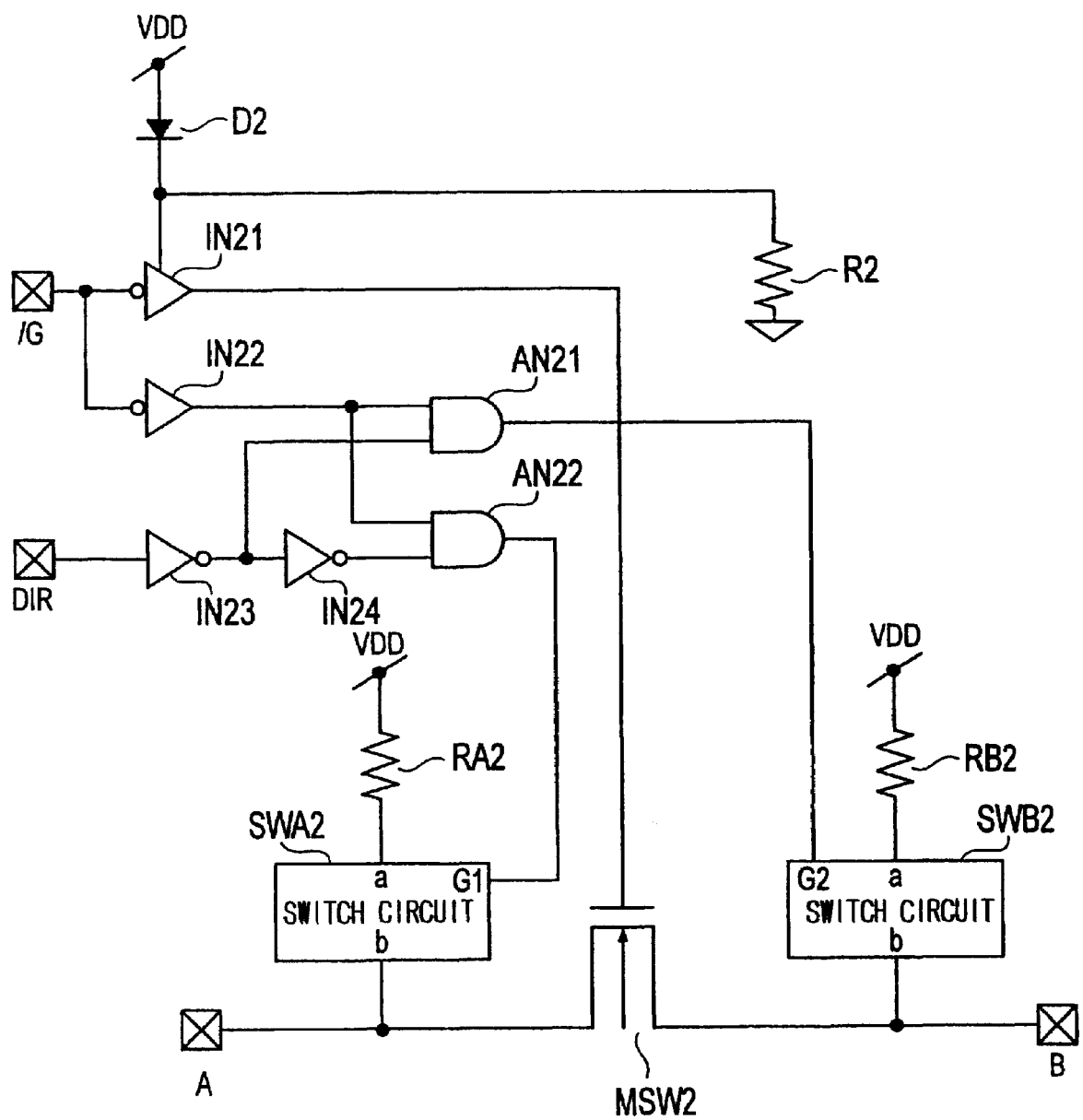
FIG. 9 is a circuit diagram showing the arrangement of an interactive level shifter according to the fifthe embodiment of the present invention.
Figure 10:
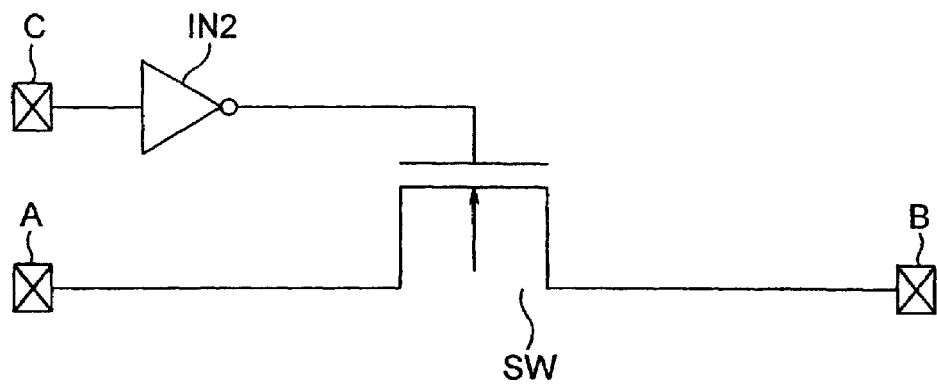
FIG. 10 is a circuit diagram showing the arrangement of a conventional bus switch circuit.
Figure 11:
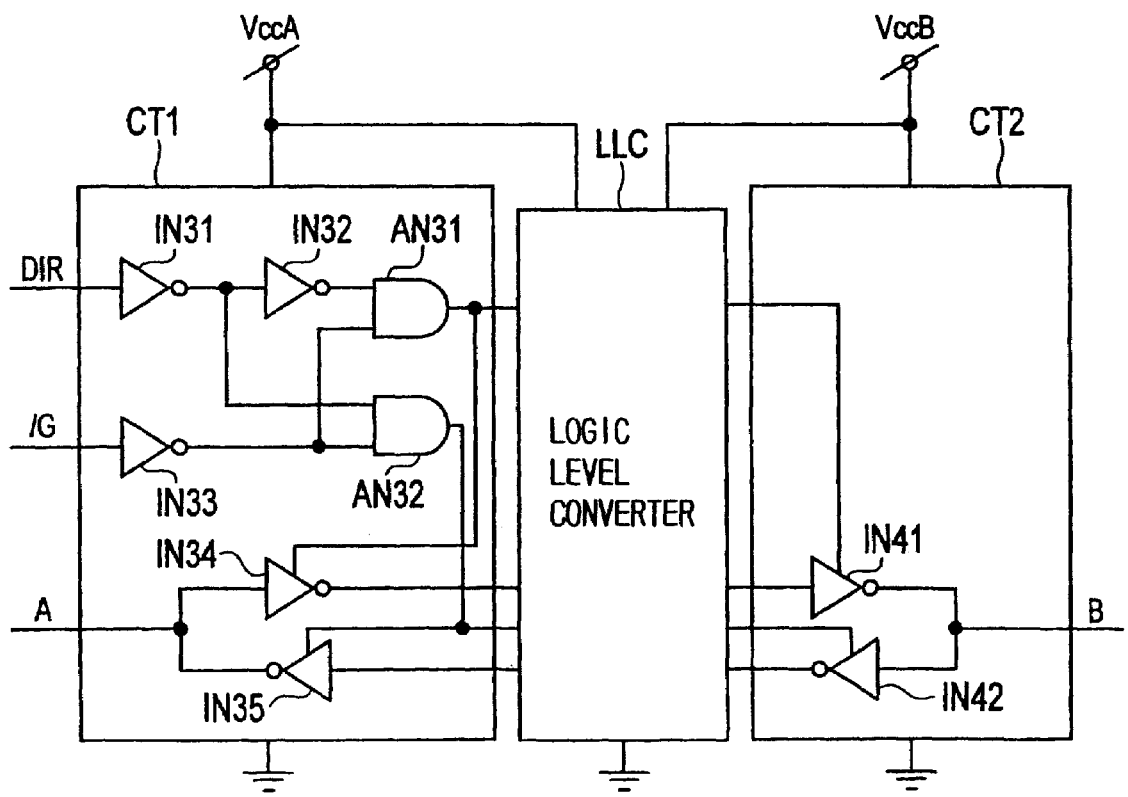
FIG. 11 is a circuit diagram showing the arrangement of a conventional interactive level shifter.

An interactive level shifter according to the fifth embodiment of the present invention has the arrangement shown in FIG. 9. This embodiment is different from the fourth embodiment in that the level relationship between power supply voltages at high level is not fixed. More specifically, a signal of a low power supply voltage VccA (e.g., 3.3 V) input from a terminal A is level-shifted to a signal of a high power supply voltage VccB (e.g., 5.0 V) and output from a terminal B. Alternatively, a signal of the high power supply voltage VccB (e.g., 5.0 V) input from the terminal A is level-shifted to a signal of the low power supply voltage VccA (e.g., 3.3 V) and output from the terminal B. Also, a signal of the low power supply voltage VccA (e.g., 3.3 V) input from the terminal B is level-shifted to a signal of the high power supply voltage VccB (e.g., 5.0 V) and output from the terminal A. Alternatively, a signal of the high power supply voltage VccB (e.g., 5.0 V) input from the terminal B is level-shifted to a signal of the low power supply voltage VccA (e.g., 3.3 V) and output from the terminal A.

One terminal and the other terminal of a main switch element MSW2 formed from an n-channel MOS transistor are connected to the terminals A and B, respectively. A control terminal /G is connected to the gate of the main switch element MSW2 through an inverter IN21. A voltage which is output from a level shift circuit formed from a diode D2 and resistor R2 and obtained by subtracting an operation threshold voltage Vdth of the diode D2 from a power supply voltage VDD is supplied to the power-supply-side terminal of the inverter IN21.

In this embodiment, a resistor RA2 and switch circuit SWA2 are connected in series between the power supply voltage VDD terminal and the terminal A. A resistor RB2 and switch circuit SWB2 are connected in series between the power supply voltage VDD terminal and the terminal B.

The switch circuits SWA2 and SWB2 are ON/OFF-controlled by switching/direction control signals G1 and G2 obtained by logic operation between a switching control signal /G input from the control terminal /G and a direction control signal DIR which is input from a direction control terminal DIR to control the level shift direction.

The logic operation is done by inverters IN22 to IN24 and AND circuits AN21 and AN22. When the switching control signal /G is in the switch disable mode (when the switching control signal G is at low level), the main switch MSW2 is turned off. The switching/direction control signals G1 and G2 of low level are output from the AND circuits AN21 and AN22 independently of the direction control signal DIR, and the main switch MSW2 is turned off. The terminal A is electrically disconnected from the power supply voltage VDD terminal. Similarly, the terminal B is electrically disconnected from the power supply voltage VDD terminal.

When the switching control signal /G is in the switch enable mode (when the switching control signal G is at high level), the main switch MSW2 is turned on. In this case, when the direction control signal DIR is at high level, the switching/direction control signal G2 of high level is output from the AND circuit AN21, and the switching/direction control signal G1 of low level is output from the AND circuit AN22. When the direction control signal DIR is at low level, the switching/direction control signal G2 of low level is output from the AND circuit AN21, and the switching/direction control signal G1 of high level is output from the AND circuit AN22.

In the switch circuit SWA2, a terminal a is connected to the power supply voltage VDD terminal through the resistor RA2, and a terminal b is connected to the terminal A. The switching/direction control signal G1 is input to a control signal G1. In the switch circuit SWB2, a terminal a is connected to the power supply voltage VDD terminal through the resistor RB2, and a terminal b is connected to the terminal B. The switching/direction control signal G2 is input to a control signal G2. The switch circuit SWA2 is turned on upon receiving the switching/direction control signal G1 of high level and off upon receiving the switching/direction control signal G1 of low level. The switch circuit SWB2 is turned on upon receiving the switching/direction control signal G2 of high level and off upon receiving the switching/direction control signal G2 of low level.

While the control signal G is at high level (switch enable), and the main switch MSW2 is turned on, one of the switch circuits SWA2 and SWB2 is turned on. When the switch circuit SWA2 is turned on, the terminal A is connected to the power supply voltage VDD terminal through the resistor RA2 serving as a pull-up resistor and the switch circuit SWA2. When the switch circuit SWB2 is turned on, the terminal B is connected to the power supply voltage VDD terminal through the resistor RB2 serving as a pull-up resistor and the switch circuit SWB2.

As described above, the power supply voltage VDD terminal is connected to the power-supply-side terminal of the inverter IN21 through the diode D2. With this arrangement, a power supply voltage VDD-Vdth obtained by subtracting the operation threshold voltage Vdth (normally about 0.7 V) of the diode D2 is supplied to the inverter IN21.

In this arrangement, a voltage VDD-Vdth (e.g., 5−0.7=4.3 V) is applied to the gate of the main switch MSW2. When the threshold voltage Vth (e.g., 1 V) of the n-channel transistor of the main switch MSW2 is taken into consideration, the level shifter operates in the following way.

1) When Signal which is Input from Terminal A and whose High Level Equals Low Power Supply Voltage VccA is Output from Terminal B When a signal whose high level equals the low power supply voltage VccA (e.g., 3.3 V) is input to the terminal A, a voltage (e.g., 4.3 V) higher than the low power supply voltage VccA (e.g., 3.3 V) by the threshold voltage Vth (e.g., 1 V) of the n-channel transistor is input to the gate of the n-channel transistor. Hence, the main switch MSW2 is turned on.

Since the power supply voltage VDD (e.g., 5 V) is connected to the terminal B through the switch circuit SWB2 in the ON state and the pull-up resistor RB2, a signal whose high level equals the power supply voltage VDD is output from the terminal B.

With this operation, the signal which is input from the terminal A and whose high level equals the low power supply voltage VccA is output from the terminal B as a signal whose high level equals the high power supply voltage VccB without any voltage drop corresponding to the threshold voltage Vth of the main switch MSW2.

2) When Signal which is Input from Terminal A and whose High Level Equals High Power Supply Voltage VccB is Output from Terminal B A signal whose high level equals the high power supply voltage VccB (e.g., 5.0 V) is input to the terminal A. The power supply voltage VDD terminal is connected to the terminal A through the resistor RA2 and switch circuit SWA2 in the ON state. A voltage (e.g., 4.3 V) lower than the high power supply voltage VccB by the operation threshold voltage Vdth (e.g., 0.7 V) of the diode D2 is input to the gate of the n-channel transistor of the main switch MSW2. Hence, the main switch MSW2 is turned on. In addition, a signal whose high level equals a voltage (e.g., 3.3 V) equal to the low power supply voltage VccA lower by the threshold voltage Vth (e.g., 1.0 V) of the n-channel transistor is output from the main switch MSW2 and externally output from the terminal B.

With this operation, the signal which is input from the terminal A and whose high level equals the high power supply voltage VccB is output from the terminal B as a signal whose high level equals the low power supply voltage VccA.

3) When Signal which is Input from Terminal B and whose High Level Equals Low Power Supply Voltage VccA is Output from Terminal A When a signal whose high level equals the low power supply voltage VccA (e.g., 3.3 V) is input to the terminal B, a voltage (e.g., 4.3 V) higher than the low power supply voltage VccA (e.g., 3.3 V) by the threshold voltage Vth (e.g., 1 V) of the n-channel transistor is input to the gate of the n-channel transistor. Hence, the main switch MSW2 is turned on.

Since the power supply voltage VDD (e.g., 5 V) is connected to the terminal A through the switch circuit SWA2 in the ON state and the pull-up resistor RA2, a signal whose high level equals the power supply voltage VDD is output from the terminal A.

With this operation, the signal which is input from the terminal B and whose high level equals the low power supply voltage VccA is output from the terminal A as a signal whose high level equals the high power supply voltage VccB without any voltage drop corresponding to the threshold voltage Vth of the main switch MSW2.

4) When Signal which is Input from Terminal B and whose High Level Equals High Power Supply Voltage VccB is Output from Terminal A A signal whose high level equals the high power supply voltage VccB (e.g., 5.0 V) is input to the terminal B. The power supply voltage VDD terminal is connected to the terminal B through the resistor RB2 and switch circuit SWB2 in the ON state. A voltage (e.g., 4.3 V) lower than the high power supply voltage VccB by the operation threshold voltage Vdth (e.g., 0.7 V) of the diode D2 is input to the gate of the n-channel transistor of the main switch MSW2. Hence, the main switch MSW2 is turned on. In addition, a signal whose high level equals a voltage (e.g., 3.3 V) equal to the low power supply voltage VccA lower by the threshold voltage Vth (e.g., 1.0 V) of the n-channel transistor is output from the main switch MSW2 and externally output from the terminal A.

With this operation, the signal which is input from the terminal B and whose high level equals the high power supply voltage VccB is output from the terminal A as a signal whose high level equals the low power supply voltage VccA.

As described above, according to this embodiment, the level relationship between signal voltages can be freely set and input/output, unlike the fourth embodiment. When a signal whose high level equals the low power supply voltage VccA is input from the terminal A or B and output from the terminal B or A through the main switch MSW2, the terminal B or A on the output side is connected to the power supply voltage VDD through the switch circuit SWB2 and pull-up resistor RB2 or the switch circuit SWA2 and pull-up resistor RA2. Since the output potential is pulled up to the power supply VDD, the output that should be output can be output from the terminal B or A on the output side without any voltage drop.

The switch circuits SWA2 and SWB2 are turned off while the control signal G is at low level (switch disable), and the main switch MSW2 is turned off. Even when the terminal B or A on the output side is at low level, any DC current is prevented from the power supply voltage VDD terminal to the terminal B through the resistor RB2 and switch circuit SWB2 or from the power supply voltage VDD terminal to the terminal A through the resistor RA2 and switch circuit SWA2.

As the switch circuit SWA2 or SWB2 in the interactive level shifter according to this embodiment, the same arrangement as described with reference to FIG. 6, 7, or 8 can be used. The arrangement is the same as in the fourth embodiment except that the switching/direction control signals G1 and G2 (switch enable at high level) are used in the fifth embodiment in place of the control signal G (switch enable at high level).

As described above, in the interactive level shifter according to the above embodiment, when a signal whose high level equals a low power supply voltage is input from the first terminal, level-shifted to a signal whose high level equals a high power supply voltage through a switch element in the ON state, and output from the second terminal, the second terminal is pulled up to the same level as that of the high power supply voltage. Hence, the signal can be output without any voltage drop. In addition, while the switch element is turned off, the second terminal is disconnected from the pull-up resistor. For this reason, wasteful DC current is prevented from flowing from the high power supply voltage terminal to the second terminal through the pull-up resistor.

According to this embodiment, when a signal which controls electrical connection of the switch element and a signal which controls the level shift direction between the low power supply voltage and the high power supply voltage are input, the first or second terminal to/from which the high power supply voltage is to be input/output is pulled up. Hence, the voltage can be output without any voltage drop. In addition, while the switch element is turned off, the first or second terminal is disconnected from the pull-up resistor. For this reason, wasteful DC current is prevented from flowing from the high power supply voltage terminal to the second terminal through the pull-up resistor. Such level shift operation can be realized with a simple circuit arrangement using a single power supply.

The above-described embodiments are merely examples and do not limit the present invention. For example, the arrangements of the switch circuits shown in FIGS. 6 to 8 are merely examples, and changes and modifications can be made as needed.

What is claimed is:

1. A bus switch circuit comprising:
   a switch element which has two terminals connected between first and second terminals and whose electrical connection is controlled when a control signal is input to a control terminal;
   a first pull-up resistor and first switch circuit connected in series between a power supply voltage terminal and the first terminal; and
   a second pull-up resistor and second switch circuit connected in series between the power supply voltage terminal and the second terminal,
   wherein electrical connection of said first switch circuit is controlled upon receiving the control signal, when said switch element is turned on, said first switch circuit is turned on to connect the power supply voltage terminal to the first terminal through said first pull-up resistor, when said switch element is turned off, said first switch circuit is turned off to disconnect the power supply voltage terminal from the first terminal, during a term when said switch element is in an on-state, said first switch circuit is kept on, and
   electrical connection of said second switch circuit is controlled upon receiving the control signal, when said switch element is turned on, said second switch circuit is turned on to connect the power supply voltage terminal to the second terminal through said second pull-up resistor, when said switch element is turned off, said second switch circuit is turned off to disconnect the power supply voltage terminal from the second terminal during a term when said switch element is in an on-state, said second switch circuit is kept on.

2. A circuit according to claim 1, wherein
each of said first and second switch circuits comprises
a first switch element including an n-channel transistor having a source and drain connected between a third terminal connected to the first or second terminal and a fourth terminal connected to one terminal of said pull-up resistor, and a p-channel transistor having a source and drain connected between the third terminal and the fourth terminal, the n-channel transistor having a gate which receives the control signal to control electrical connection of the n-channel transistor, and the p-channel transistor having a gate which receives a gate control signal to control electrical connection of the p-channel transistor,
a first comparator which compares a potential of the third terminal with that of the fourth terminal and outputs a higher potential as a first potential,
a second comparator which compares the first potential with a power supply voltage, and when the first potential is higher, supplies the first potential to an n-well,
a first circuit which receives the control signal, when the control signal is in a switch disable mode, outputs the first potential output from said first comparator, and when the control signal is in a switch enable mode, outputs an ON signal,
a second switch element and second circuit connected in series between the power supply voltage terminal and a ground terminal,
when the first potential output from said first circuit is supplied to a control terminal, and the first potential is lower than the power supply voltage, said second switch element being turned on to output the power supply voltage, when the first potential is not less than the power supply voltage, said second switch element being turned off, and when the ON signal is supplied to the control terminal, said second switch element being turned on to output the power supply voltage,
said second circuit outputting an OFF signal when the control signal is received, the control signal is in the switch disable mode, and said second switch element outputs the power supply voltage, and outputting the ON signal when the control signal is in the switch enable mode,
a third switch element which has two terminals connected between the n-well and a gate of the p-channel transistor, said third switch element having a control terminal which receives the control signal to control electrical connection of said third switch element, being turned on to supply the potential of the n-well to the gate of the p-channel transistor when the control signal is in the switch disable, and being turned off when the control signal is in the switch disable mode, and
a fourth switch element which has two terminals connected between the power supply voltage terminal and the n-well and is turned on to supply the power supply voltage to the n-well when the ON signal is supplied to a control terminal,
the p-channel transistor of said first switch element is formed in the n-well,
when the control signal is in the switch enable mode, the n-channel transistor is turned on, the ON signal is supplied to the gate of the p-channel transistor to turn on the p-channel transistor, and said fourth switch is turned on to supply the power supply voltage to the n-well,
when the control signal is in the switch disable mode, and potentials of the third and fourth terminals are lower than the power supply voltage, a higher one of the potentials of the third and fourth terminals is supplied to the gate of said second switch element through said first comparator and first circuit to turn on said second switch element, the power supply voltage is supplied to said second circuit through said second switch element, and said second circuit generates the OFF signal and supplies the OFF signal to the control terminals of said first and fourth switch elements to turn off said first and fourth switch elements, and
when at least one of the potentials of the third and fourth terminals is not less than the power supply voltage, a higher one of the potentials of the third and fourth terminals is supplied to the n-well through said first and second comparators as the first potential, and said third switch element is turned on to supply the first potential of the n-well to the gate of the p-channel transistor.

3. A circuit according to claim 1, wherein
each of said first and second switch circuits comprises
a switch element having a CMOS structure including a first n-channel transistor having a source and drain connected between a third terminal connected to the first or second terminal and a fourth terminal connected to one terminal of said pull-up resistor and a gate which receives the control signal, and a first p-channel transistor having a source and drain connected between the third terminal and the fourth terminal,
a second p-channel transistor having one terminal connected to an n-well and a gate connected to the power supply voltage terminal,
a third p-channel transistor having one terminal connected to the other terminal of said second p-channel transistor, a gate connected to the fourth terminal, and the other terminal connected to the third terminal,
a fourth p-channel transistor having one terminal connected to the n-well and a gate connected to the power supply voltage terminal,
a fifth p-channel transistor having one terminal connected to the other terminal of said fourth p-channel transistor, a gate connected to the third terminal, and the other terminal connected to the fourth terminal,
a sixth p-channel transistor having one terminal connected to the other terminal of said second p-channel transistor and a gate which receives the control signal,
a seventh p-channel transistor having one terminal connected to the other terminal of said fourth p-channel transistor, a gate which receives the control signal, and the other terminal connected to the other terminal of said sixth p-channel transistor,
a second n-channel transistor having one terminal connected to the other terminal of said sixth p-channel transistor, a gate which receives the control signal, and the other terminal grounded,
a third n-channel transistor having one terminal connected to the other terminal of said seventh p-channel transistor, a gate which receives the control signal, and the other terminal grounded,
an eighth p-channel transistor having one terminal connected to the power supply voltage terminal and a gate connected to the other terminal of said sixth p-channel transistor, a ninth p-channel transistor having one terminal connected to the other terminal of said eighth p-channel transistor and a gate which receives the control signal,
a fourth n-channel transistor having one terminal connected to the other terminal of said ninth p-channel transistor, a gate which receives the control signal, and the other terminal grounded,
a 10th p-channel transistor having one terminal connected to the n-well, a gate which receives the control signal, and the other terminal connected to the gate of said first p-channel transistor, and
a 11th p-channel transistor having one terminal connected to the power supply voltage terminal, a gate connected to the gate of said first p-channel transistor, and the other terminal connected to the n-well, and
back gates of said first to 11th p-channel transistors are connected to the n-well.

4. A circuit according to claim 1, wherein
each of said first and second switch circuits comprises
a switch element having a CMOS structure including a first n-channel transistor having a source and drain connected between a third terminal connected to the first or second terminal and a fourth terminal connected to one terminal of said pull-up resistor and a gate which receives the control signal, and a first p-channel transistor having a source and drain connected between the third terminal and the fourth terminal,
a second p-channel transistor having one terminal connected to the third terminal, a gate connected to the fourth terminal, and the other terminal connected to an n-well,
a third p-channel transistor having one terminal connected to the fourth terminal, a gate connected to the third terminal, and the other terminal connected to the n-well,
a fourth p-channel transistor having one terminal connected to the n-well, a gate which receives the control signal, and the other terminal connected to the gate of said first p-channel transistor, and
a second n-channel transistor having one terminal connected to the gate of said first p-channel transistor, a gate which receives the control signal, and the other terminal grounded.

5. An interactive level shifter comprising:
a level shift section which receives a power supply voltage and outputs a first power supply voltage lower by a predetermined voltage;
a control signal generation section which receives the first power supply voltage and outputs a first control signal having the power supply voltage at high level and a second control signal having the first power supply voltage at high level;
a switch element having two terminals connected between first and second terminals and whose electrical connection is controlled when the second control signal is input to a control terminal; and
a pull-up resistor and switch circuit connected in series between a power supply voltage terminal and the second terminal,
wherein electrical connection of said switch circuit is controlled upon receiving the first control signal, when said switch element is turned on, said switch circuit is turned on to connect the power supply voltage terminal to the second terminal through said pull-up resistor, and when said switch element is turned off, said switch circuit is turned off to disconnect the power supply voltage terminal from the second terminal.

6. A level shifter according to claim 5, wherein
said switch circuit comprises
a first switch element including an n-channel transistor having a source and drain connected between a third terminal connected to the second terminal and a fourth terminal connected to one terminal of said pull-up resistor, and a p-channel transistor having a source and drain connected between the third terminal and the fourth terminal, the n-channel transistor having a gate which receives the first control signal to control electrical connection of the n-channel transistor, and the p-channel transistor having a gate which receives a gate control signal to control electrical connection of the p-channel transistor,
a first comparator which compares a potential of the third terminal with that of the fourth terminal and outputs a higher potential as a first potential,
a second comparator which compares the first potential with a power supply voltage, and when the first potential is higher, supplies the first potential to an n-well,
a first circuit which receives the first control signal, when the first control signal is in a switch disable mode, outputs the first potential output from said first comparator, and when the first control signal is in a switch enable mode, outputs an ON signal,
a second switch element and second circuit connected in series between the power supply voltage terminal and a ground terminal,
when the first potential output from said first circuit is supplied to a control terminal, and the first potential is lower than the power supply voltage, said second switch element being turned on to output the power supply voltage, when the first potential is not less than the power supply voltage, said second switch element being turned off, and when the ON signal is supplied to the control terminal, said second switch element being turned on to output the power supply voltage,
said second circuit outputting an OFF signal when the first control signal is received, the first control signal is in the switch disable mode, and said second switch element outputs the power supply voltage, and outputting the ON signal when the first control signal is in the switch enable mode,
a third switch element which has two terminals connected between the n-well and the p-channel transistor, said third switch element having a control terminal which receives the first control signal to control electrical connection of said third switch element, being turned on to supply the potential of the n-well to the gate of the p-channel transistor when the first control signal is in the switch disable, and being turned off when the first control signal is in the switch disable mode, and
a fourth switch element which has two terminals connected between the power supply voltage terminal and the n-well and is turned on to supply the power supply voltage to the n-well when the ON signal is supplied to a control terminal,
the p-channel transistor of said first switch element is formed in the n-well,
when the first control signal is in the switch enable mode, the n-channel transistor is turned on, the ON signal is supplied to the gate of the p-channel transistor to turn on the p-channel transistor, and said fourth switch is turned on to supply the power supply voltage to the n-well,
when the first control signal is in the switch disable mode, and potentials of the third and fourth terminals are lower than the power supply voltage, a higher one of the potentials of the third and fourth terminals is supplied to the gate of said second switch element through said first comparator and first circuit to turn on said second switch element, the power supply voltage is supplied to said second circuit through said second switch element, and said second circuit generates the OFF signal and supplies the OFF signal to the control terminals of said first and fourth switch elements to turn off said first and fourth switch elements, and when at least one of the potentials of the third and fourth terminals is not less than the power supply voltage, a higher one of the potentials of the third and fourth terminals is supplied to the n-well through said first and second comparators as the first potential, and said third switch element is turned on to supply the first potential of the n-well to the gate of the p-channel transistor.

7. A level shifter according to claim 5, wherein said switch circuit comprises a switch element having a CMOS structure including a first n-channel transistor having a source and drain connected between a third terminal connected to the second terminal and a fourth terminal connected to one terminal of said pull-up resistor and a gate which receives the first control signal, and a first p-channel transistor having a source and drain connected between the third terminal and the fourth terminal, a second p-channel transistor having one terminal connected to an n-well and a gate connected to the power supply voltage terminal, a third p-channel transistor having one terminal connected to the other terminal of said second p-channel transistor, a gate connected to the fourth terminal, and the other terminal connected to the third terminal, a fourth p-channel transistor having one terminal connected to the n-well and a gate connected to the power supply voltage terminal, a fifth p-channel transistor having one terminal connected to the other terminal of said fourth p-channel transistor, a gate connected to the third terminal, and the other terminal connected to the fourth terminal, a sixth p-channel transistor having one terminal connected to the other terminal of said second p-channel transistor and a gate which receives the first control signal, a seventh p-channel transistor having one terminal connected to the other terminal of said fourth p-channel transistor, a gate which receives the first control signal, and the other terminal connected to the other terminal of said sixth p-channel transistor, a second n-channel transistor having one terminal connected to the other terminal of said sixth p-channel transistor, a gate which receives the first control signal, and the other terminal grounded, a third n-channel transistor having one terminal connected to the other terminal of said seventh p-channel transistor, a gate which receives the first control signal, and the other terminal grounded, an eighth p-channel transistor having one terminal connected to the power supply voltage terminal and a gate connected to the other terminal of said sixth p-channel transistor, a ninth p-channel transistor having one terminal connected to the other terminal of said eighth p-channel transistor and a gate which receives the first control signal, a fourth n-channel transistor having one terminal connected to the other terminal of said ninth p-channel transistor, a gate which receives the first control signal, and the other terminal grounded, a 10th p-channel transistor having one terminal connected to the n-well, a gate which receives the first control signal, and the other terminal connected to the gate of said first p-channel transistor, and a 11th p-channel transistor having one terminal connected to the power supply voltage terminal, a gate connected to the gate of said first p-channel transistor, and the other terminal connected to the n-well, and back gates of said first to 11th p-channel transistors are connected to the n-well.

8. A level shifter according to claim 5, wherein said switch circuit comprises a switch element having a CMOS structure including a first n-channel transistor having a source and drain connected between a third terminal connected to the second terminal and a fourth terminal connected to one terminal of said pull-up resistor and a gate which receives the first control signal, and a first p-channel transistor having a source and drain connected between the third terminal and the fourth terminal, a second p-channel transistor having one terminal connected to the third terminal, a gate connected to the fourth terminal, and the other terminal connected to an n-well, a third p-channel transistor having one terminal connected to the fourth terminal, a gate connected to the third terminal, and the other terminal connected to the n-well, a fourth p-channel transistor having one terminal connected to the n-well, a gate which receives the first control signal, and the other terminal connected to the gate of said first p-channel transistor, and a second n-channel transistor having one terminal connected to the gate of said first p-channel transistor, a gate which receives the first control signal, and the other terminal grounded.

9. An interactive level shifter comprising:

a level shift section which receives a power supply voltage and outputs a first power supply voltage lower by a predetermined voltage;

a control signal generation section which outputs a first switching control signal having the power supply voltage at high level and a second switching control signal having the first power supply voltage at high level;

a switch element having two terminals connected between first and second terminals and whose electrical connection is controlled when the second switching control signal is input to a control terminal;

a control signal generation section which receives a direction control signal to control a level shift direction and the first switching control signal, executes control so as to cause the direction control signal to level shift a signal whose high level equals a low voltage input to the first terminal to a signal whose high level equals a high voltage and output the signal from the second terminal or executes control so as to cause the direction control signal to level shift a signal whose high level equals the high voltage input to the second terminal to a signal whose high level equals the low voltage and output the signal from the first terminal, when the first switching control signal is in a switch enable mode, generates a second ON signal to turn on a second switch circuit and executes control so as to cause the direction control signal to level shift a signal whose high level equals the high voltage input to the first terminal to a signal whose high level equals the low voltage and output the signal from the second terminal or executes control so as to cause the direction control signal to level shift a signal whose high level equals the low voltage input to the second terminal to a signal whose high level equals the high voltage and output the signal from the first terminal, when the first control signal is in the switch enable mode, generates a first ON signal to turn on a first switch circuit, and when the first control signal is in a switch disable mode, generates and outputs first and second OFF signals;

a first pull-up resistor and first switch circuit connected series between a power supply voltage terminal and the first terminal; and a second pull-up resistor and second switch circuit connected series between the power supply voltage terminal and the second terminal, wherein upon receiving the first ON signal, said first switch circuit is turned on to connect the power supply voltage terminal to the first terminal through said first pull-up resistor, and upon receiving the first OFF signal, said first switch circuit is turned off to disconnect the power supply voltage terminal from the first terminal, and upon receiving the second ON signal, said second switch circuit is turned on to connect the power supply voltage terminal to the second terminal through said second pull-up resistor, and upon receiving the second OFF signal, said second switch circuit is turned off to disconnect the power supply voltage terminal from the second terminal.

10. A level shifter according to claim 9, wherein
each of said first and second switch circuits comprises
a first switch element including an n-channel transistor having a source and drain connected between a third terminal connected to the first or second terminal and a fourth terminal connected to one terminal of said pull-up resistor, and a p-channel transistor having a source and drain connected between the third terminal and the fourth terminal, the n-channel transistor being turned on when the first or second ON signal is input to a gate and off when the first or second OFF signal is input to the gate, and the p-channel transistor having a gate which receives a gate control signal to control electrical connection of the p-channel transistor, a first comparator which compares a potential of the third terminal with that of the fourth terminal and outputs a higher potential as a first potential, a second comparator which compares the first potential with a power supply voltage, and when the first potential is higher, supplies the first potential to an n-well, a first circuit which outputs the first potential output from said first comparator upon receiving the first or second OFF signal, and outputs an ON signal upon receiving the first or second ON signal, a second switch element and second circuit connected in series between the power supply voltage terminal and a ground terminal, when the first potential output from said first circuit is supplied to a control terminal, and the first potential is lower than the power supply voltage, said second switch element being turned on to output the power supply voltage, when the first potential is not less than the power supply voltage, said second switch element being turned off, and when the ON signal is supplied to the control terminal, said second switch element being turned on to output the power supply voltage, said second circuit outputting an OFF signal when the first or second OFF signal is received, and said second switch element outputs the power supply voltage, and outputs the ON signal when the first or second ON signal is supplied, a third switch element which has two terminals connected between the n-well and a gate of the p-channel transistor, said third switch element having a control terminal which receives the control signal to control electrical connection of said third switch element, being turned on to supply the potential of the n-well to the gate of the p-channel transistor when the first or second OFF signal is supplied, and being turned off when the first or second ON signal is supplied, and a fourth switch element which has two terminals connected between the power supply voltage terminal and the n-well and is turned on to supply the power supply voltage to the n-well when the ON signal is supplied to a control terminal, the p-channel transistor of said first switch element is formed in the n-well, when the first or second ON signal is supplied, the n-channel transistor is turned on, the ON signal is supplied to the gate of the p-channel transistor to turn on the p-channel transistor, and said fourth switch is turned on to supply the power supply voltage to the n-well, when the first or second OFF signal is supplied, and potentials of the third and fourth terminals are lower than the power supply voltage, a higher one of the potentials of the third and fourth terminals is supplied to the gate of said second switch element through said first comparator and first circuit to turn on said second switch element, the power supply voltage is supplied to said second circuit through said second switch element, and said second circuit generates the OFF signal and supplies the OFF signal to the control terminals of said first and fourth switch elements to turn off said first and fourth switch elements, and when at least one of the potentials of the third and fourth terminals is not less than the power supply voltage, a higher one of the potentials of the third and fourth terminals is supplied to the n-well through said first and second comparators as the first potential, and said third switch element is turned on to supply the first potential of the n-well to the gate of the p-channel transistor.

11. A level shifter according to claim 9, wherein
each of said first and second switch circuits comprises
a switch element having a CMOS structure including a first n-channel transistor having a source and drain connected between a third terminal connected to the first or second terminal and a fourth terminal connected to one terminal of said pull-up resistor, the n-channel transistor being turned on when the first or second ON signal is supplied to a gate and off when the first or second OFF signal is supplied to the gate, and a first p-channel transistor having a source and drain connected between the third terminal and the fourth terminal, a second p-channel transistor having one terminal connected to an n-well and a gate connected to the power supply voltage terminal, a third p-channel transistor having one terminal connected to the other terminal of said second p-channel transistor, a gate connected to the fourth terminal, and the other terminal connected to the third terminal, a fourth p-channel transistor having one terminal connected to the n-well and a gate connected to the power supply voltage terminal, a fifth p-channel transistor having one terminal connected to the other terminal of said fourth p-channel transistor, a gate connected to the third terminal, and the other terminal connected to the fourth terminal, a sixth p-channel transistor having one terminal connected to the other terminal of said second p-channel transistor and a gate which receives the first or second ON signal or the first or second OFF signal, a seventh p-channel transistor having one terminal connected to the other terminal of said fourth p-channel transistor, a gate which receives the first or second ON signal or the first or second OFF signal, and the other terminal connected to the other terminal of said sixth p-channel transistor, a second n-channel transistor having one terminal connected to the other terminal of said sixth p-channel transistor, a gate which receives the first or second ON signal or the first or second OFF signal, and the other terminal grounded, a third n-channel transistor having one terminal connected to the other terminal of said seventh p-channel transistor, a gate which receives the first or second ON signal or the first or second OFF signal, and the other terminal grounded, an eighth p-channel transistor having one terminal connected to the power supply voltage terminal and a gate connected to the other terminal of said sixth p-channel transistor, a ninth p-channel transistor having one terminal connected to the other terminal of said eighth p-channel transistor and a gate which receives the first or second ON signal or the first or second OFF signal, a fourth n-channel transistor having one terminal connected to the other terminal of said ninth p-channel transistor, a gate which receives the first or second ON signal or the first or second OFF signal, and the other terminal grounded, a 10th p-channel transistor having one terminal connected to the n-well, a gate which receives the first or second ON signal or the first or second OFF signal, and the other terminal connected to the gate of said first p-channel transistor, and a 11th p-channel transistor having one terminal connected to the power supply voltage terminal, a gate connected to the gate of said first p-channel transistor, and the other terminal connected to the n-well, and back gates of said first to 11th p-channel transistors are connected to the n-well.

12. A level shifter according to claim 9, wherein each of said first and second switch circuits comprises a switch element having a CMOS structure including a first n-channel transistor having a source and drain connected between a third terminal connected to the first or second terminal and a fourth terminal connected to one terminal of said pull-up resistor and a gate which receives the first or second ON signal or the first or second OFF signal, and a first p-channel transistor having a source and drain connected between the third terminal and the fourth terminal, a second p-channel transistor having one terminal connected to the third terminal, a gate connected to the fourth terminal, and the other terminal connected to an n-well, a third p-channel transistor having one terminal connected to the fourth terminal, a gate connected to the third terminal, and the other terminal connected to the n-well, a fourth p-channel transistor having one terminal connected to the n-well, a gate which receives the first or second ON signal or the first or second OFF signal, and the other terminal connected to the gate of said first p-channel transistor, and a second n-channel transistor having one terminal connected to the gate of said first p-channel transistor, a gate which receives the first or second ON signal or the first or second OFF signal, and the other terminal grounded.

* * * * *